United States Patent
Morinaga et al.

(10) Patent No.: US 10,978,529 B2
(45) Date of Patent: Apr. 13, 2021

(54) ACTIVE MATRIX SUBSTRATE AND METHOD FOR MANUFACTURING THE SAME

(71) Applicant: Sharp Kabushiki Kaisha, Sakai (JP)

(72) Inventors: Junichi Morinaga, Sakai (JP); Hikaru Yoshino, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 29 days.

(21) Appl. No.: 16/571,322

(22) Filed: Sep. 16, 2019

(65) Prior Publication Data

US 2020/0089069 A1     Mar. 19, 2020

Related U.S. Application Data

(60) Provisional application No. 62/733,268, filed on Sep. 19, 2018.

(51) Int. Cl.
*H01L 27/32* (2006.01)
*H01L 27/12* (2006.01)
(Continued)

(52) U.S. Cl.
CPC ...... *H01L 27/3258* (2013.01); *G02F 1/13439* (2013.01); *G02F 1/133345* (2013.01);
(Continued)

(58) Field of Classification Search
CPC .......... G02F 1/136286; G02F 1/13439; G02F 1/133345; H01L 51/56; H01L 27/3262; H01L 27/3276; H01L 27/3258
See application file for complete search history.

(56) References Cited

U.S. PATENT DOCUMENTS

2003/0052336 A1 *   3/2003   Yamazaki ......... H01L 29/66757
                                                                257/200
2008/0024416 A1     1/2008   Onogi et al.
(Continued)

FOREIGN PATENT DOCUMENTS

JP     2008-032899 A     2/2008
JP     2008-040343 A     2/2008
(Continued)

*Primary Examiner* — Michael Jung
(74) *Attorney, Agent, or Firm* — Keating & Bennett, LLP

(57) ABSTRACT

An active matrix substrate includes a first TFT of a peripheral circuit and a second TFT arranged in each pixel, wherein: the first TFT is a top gate or double gate TFT that includes an upper gate electrode on a portion of a first oxide semiconductor layer with a gate insulating layer interposed therebetween; the second TFT is a bottom gate TFT that includes a second lower gate electrode arranged on the substrate side of a second oxide semiconductor layer with a lower insulating layer interposed therebetween and includes no gate electrode on the second oxide semiconductor layer; the second TFT including: an island-shaped insulator layer that is arranged on a portion of the second oxide semiconductor layer so as to overlap with at least a portion of the second lower gate electrode, as seen from a direction normal to the substrate; an upper insulating layer that is arranged on the second oxide semiconductor layer and the island-shaped insulator layer; and a source electrode that is arranged on the upper insulating layer, wherein: a portion of the second oxide semiconductor layer that does not overlap with the island-shaped insulator layer is a low resistance region that has a lower specific resistance than a portion thereof that overlaps with the island-shaped insulator layer; and in an intersection between a source bus line and a gate bus line, the lower insulating layer and the upper insulating layer are located between these bus lines.

17 Claims, 16 Drawing Sheets

(51) Int. Cl.
  *G02F 1/1362* (2006.01)
  *G02F 1/1343* (2006.01)
  *G02F 1/1333* (2006.01)
  *H01L 51/56* (2006.01)

(52) U.S. Cl.
  CPC .... *G02F 1/136286* (2013.01); *H01L 27/1251* (2013.01); *H01L 27/3244* (2013.01); *H01L 27/3262* (2013.01); *H01L 27/3276* (2013.01); *H01L 27/3279* (2013.01); *H01L 51/56* (2013.01)

(56) References Cited

U.S. PATENT DOCUMENTS

| | | |
|---|---|---|
| 2008/0035920 A1 | 2/2008 | Takechi et al. |
| 2009/0323005 A1 | 12/2009 | Ota |
| 2011/0012105 A1 | 1/2011 | Yamazaki et al. |
| 2012/0138922 A1 | 6/2012 | Yamazaki et al. |
| 2012/0241733 A1 | 9/2012 | Morooka et al. |
| 2013/0320334 A1 | 12/2013 | Yamazaki et al. |
| 2014/0286076 A1 | 9/2014 | Aoki et al. |
| 2015/0108467 A1 | 4/2015 | Moriguchi et al. |
| 2016/0247831 A1* | 8/2016 | Makita ............... H01L 27/1251 |
| 2017/0054029 A1 | 2/2017 | Koezuka et al. |
| 2017/0125452 A1* | 5/2017 | Ide ...................... H01L 27/1225 |
| 2017/0154941 A1* | 6/2017 | Oh ......................... H01L 51/56 |
| 2017/0162606 A1* | 6/2017 | Yan ................... H01L 29/78648 |
| 2019/0081085 A1* | 3/2019 | Ozeki ................. G02F 1/13454 |
| 2020/0027938 A1* | 1/2020 | Song ................... H01L 27/1251 |

FOREIGN PATENT DOCUMENTS

| | | |
|---|---|---|
| JP | 2010-008758 A | 1/2010 |
| JP | 2012-134475 A | 7/2012 |
| JP | 2012-204077 A | 10/2012 |
| JP | 2014-007399 A | 1/2014 |
| JP | 2014-209727 A | 11/2014 |
| JP | 2015-179805 A | 10/2015 |
| JP | 2017-130672 A | 7/2017 |
| JP | 2017-228752 A | 12/2017 |
| WO | 2012/086513 A1 | 6/2012 |

* cited by examiner

ACTIVE MATRIX SUBSTRATE AND METHOD FOR MANUFACTURING THE SAME

This application claims priority to U.S. Provisional Patent Application No. 62/733,268 filed on Sep. 19, 2018, the disclosure of which is incorporated herein by reference.

BACKGROUND

1. Technical Field

The present invention relates to an active matrix substrate using an oxide semiconductor and a method for manufacturing the same.

2. Description of the Related Art

Display devices having an active matrix substrate on which a switching element is provided for each pixel have been widely used. An active matrix substrate including thin film transistors (hereinafter "TFTs") as switching elements is referred to as a TFT substrate. Note that in the present specification, a portion of a TFT substrate that corresponds to a pixel of a display device may also be referred to as a pixel. A TFT provided as a switching element for each pixel of the active matrix substrate is referred to as a "pixel TFT".

In recent years, it has been proposed to use an oxide semiconductor as the material of the active layer of a TFT, instead of an amorphous silicon or a polycrystalline silicon (for example, Patent Document 1: Japanese Laid-Open Patent Publication No. 2012-204077). Such a TFT is referred to as an "oxide semiconductor TFT". An oxide semiconductor has a higher mobility than an amorphous silicon. Therefore, an oxide semiconductor TFT is capable of operating faster than an amorphous silicon TFT. Since an oxide semiconductor film is formed by a simpler process than a polycrystalline silicon film, it is applicable to a device that is required to have a large area.

A TFT substrate also includes a plurality of gate bus lines and a plurality of source bus lines, wherein the gate electrode of a pixel TFT is electrically connected to a corresponding one of the gate bus lines and the source electrode thereof to a corresponding one of the source bus lines. It is often the case that the gate electrode of the pixel TFT is formed from the same conductive film as the gate bus lines, and the source and drain electrodes thereof are formed from the same conductive film as the source bus lines. In the present specification, a layer that is formed from the same conductive film as the gate bus lines is referred to as a "gate metal layer", and a layer that is formed from the same conductive film as the source bus lines is referred to as a "source metal layer".

Moreover, in some cases, peripheral circuits such as driving circuits are monolithically (integrally) formed on a TFT substrate. In the present specification, TFTs used in a monolithic peripheral circuit are referred to as "circuit TFTs".

SUMMARY

In view of the TFT substrate manufacturing process, it is preferred that pixel TFTs and circuit TFTs are formed by using the same oxide semiconductor film and have the same TFT structure or similar TFT structures.

However, characteristics demanded for pixel TFTs and circuit TFTs are different from each other, and it has been difficult to selectively produce oxide semiconductor TFTs each having characteristics in accordance with the application thereof without complicating the manufacturing process.

Moreover, according to a study by the present inventor, where TFTs of the top gate structure are used as circuit TFTs, for which a high current supplying ability is demanded, for example, if TFTs of the top gate structure are used also as pixel TFTs, the capacitance Cgs may be high in the intersection between gate bus lines and source bus lines (the details will be described later). When such a TFT substrate is used as a display device, blunting of signal waveform of signals supplied to bus lines may become significant, thereby causing brightness non-uniformity, flicker, etc., thus lowering the display quality. When the capacitance Cgs is high, the power consumption may increase. These problems are particularly pronounced with high-definition display devices having a large number of bus lines.

An object of one embodiment of the present invention is to provide an active matrix substrate including oxide semiconductor TFTs that have characteristics suitable for their respective applications, for use in pixels and for use in peripheral circuits, wherein it is possible to suppress the increase in parasitic capacitance.

The present specification discloses an active matrix substrate, a method for manufacturing an active matrix substrate and a display device as set forth in items below.

[Item 1] An active matrix substrate having a display region including a plurality of pixel regions and a non-display region provided around the display region, the active matrix substrate including:

a substrate having a primary surface; a peripheral circuit provided in the non-display region that is supported on the primary surface side of the substrate and includes at least one first TFT; a second TFT that is arranged for each of the plurality of pixel regions in the display region; a source metal layer that includes a plurality of source bus lines extending in a first direction; and a gate metal layer that includes a plurality of gate bus lines extending in a second direction that crosses the first direction, wherein:

the at least one first TFT is a top gate structure TFT that includes a first oxide semiconductor layer and an upper gate electrode arranged on a portion of the first oxide semiconductor layer with a gate insulating layer interposed therebetween or a double gate structure TFT that additionally includes, relative to the top gate structure TFT, a first lower gate electrode arranged on the substrate side of the first oxide semiconductor layer;

the second TFT is a bottom gate structure TFT that includes a second oxide semiconductor layer and a second lower gate electrode arranged on the substrate side of the second oxide semiconductor layer with a lower insulating layer interposed therebetween, wherein a gate electrode is absent above the second oxide semiconductor layer;

the second TFT includes:
  an island-shaped insulator layer that is arranged on a portion of the second oxide semiconductor layer so as to overlap with at least a portion of the second lower gate electrode, as seen from a normal direction to the primary surface of the substrate;
  an upper insulating layer that is arranged on the second oxide semiconductor layer and the island-shaped insulator layer;
  a source electrode that is arranged on the upper insulating layer and is in contact with another portion of the second oxide semiconductor layer in a source-side opening formed in the upper insulating layer;

the second oxide semiconductor layer is formed from a same semiconductor film as the first oxide semiconductor layer of the at least one first TFT, the island-shaped insulator layer is formed from a same insulating film as the gate insulating layer of the at least one first TFT, the second lower gate electrode is formed in the gate metal layer, and the source electrode is formed in the source metal layer;

a portion of the second oxide semiconductor layer that does not overlap with the island-shaped insulator layer is a low resistance region that has a lower specific resistance than a portion thereof that overlaps with the island-shaped insulator layer, as seen from the normal direction to the primary surface of the substrate; and in an intersection where one of the plurality of source bus lines and one of the plurality of gate bus lines cross each other, the lower insulating layer and the upper insulating layer are located between the one source bus line and the one gate bus line.

[Item 2] The active matrix substrate according to Item 1, further including an island-shaped conductor layer that is arranged between the island-shaped insulator layer and the upper insulating layer, wherein the island-shaped conductor layer is formed from a same conductive film as the upper gate electrode of the at least one first TFT.

[Item 3] The active matrix substrate according to Item 2, wherein the island-shaped conductor layer is electrically separated from other interconnects.

[Item 4] The active matrix substrate according to Item 2, wherein the island-shaped conductor layer is electrically floating.

[Item 5] The active matrix substrate according to any one of Items 2 to 4, wherein the island-shaped conductor layer is located inside the second lower gate electrode in a channel length direction of the second TFT, as seen from the normal direction to the primary surface of the substrate.

[Item 6] The active matrix substrate according to any one of Items 2 to 5, wherein the island-shaped conductor layer is located inside the second lower gate electrode, as seen from the normal direction to the primary surface of the substrate.

[Item 7] The active matrix substrate according to any one of Items 2 to 6, wherein a side surface of the island-shaped conductor layer and a side surface of the island-shaped insulator layer are aligned with each other, and a side surface of the upper gate electrode and a side surface of the gate insulating layer are aligned with each other.

[Item 8] The active matrix substrate according to Item 1, wherein an entire upper surface of the island-shaped insulator layer is in direct contact with the upper insulating layer.

[Item 9] The active matrix substrate according to Item 8, wherein as seen from the normal direction to the primary surface of the substrate, a portion of the second oxide semiconductor layer that overlaps with the island-shaped insulator layer includes a channel region that overlaps with the second lower gate electrode and a high resistance region that does not overlap with the second lower gate electrode, wherein the high resistance region is located between the channel region and the low resistance region.

[Item 10] The active matrix substrate according to any one of Items 1 to 9, wherein:

the low resistance region of the second oxide semiconductor layer includes a first region and a second region that are located on opposite sides of the island-shaped insulator layer, as seen from the normal direction to the primary surface of the substrate;

the first region is electrically connected to the source electrode; and the second region is electrically connected to a pixel electrode that is provided for each of the plurality of pixel regions.

[Item 11] The active matrix substrate according to Item 10, wherein the second TFT further includes a drain electrode that is arranged on the upper insulating layer and is in contact with the second region in a drain-side opening formed in the upper insulating layer, and the second region is electrically connected to the pixel electrode with the drain electrode interposed therebetween.

[Item 12] The active matrix substrate according to any one of Items 1 to 9, wherein:

the low resistance region of the second oxide semiconductor layer includes a first region and a second region that are located on opposite sides of the island-shaped insulator layer, as seen from the normal direction to the primary surface of the substrate;

the first region is electrically connected to the source electrode; and the second region includes a portion that functions as a pixel electrode for each of the plurality of pixel regions.

[Item 13] The active matrix substrate according to any one of Items 1 to 12, wherein:

the source electrode is electrically connected to one of the plurality of source bus lines; and the second lower gate electrode is electrically connected to one of the plurality of gate bus lines.

[Item 14] The active matrix substrate according to any one of Items 1 to 13, further including another island-shaped insulator layer that is arranged between the lower insulating layer and the upper insulating layer in the intersection.

[Item 15] The active matrix substrate according to Item 14, further including another island-shaped conductor layer that is arranged between the another island-shaped insulator layer and the upper insulating layer in the intersection, wherein the another island-shaped conductor layer is formed from a same conductive film as the upper gate electrode of the at least one first TFT.

[Item 16] The active matrix substrate according to any one of Items 1 to 15, wherein the first oxide semiconductor layer and the second oxide semiconductor layer include an In—Ga—Zn—O-based semiconductor.

[Item 17] A method for manufacturing an active matrix substrate having a display region including a plurality of pixel regions and a non-display region provided around the display region, wherein the active matrix substrate includes a peripheral circuit that is arranged in the non-display region and includes at least one first TFT, and a second TFT that is arranged for each of the plurality of pixel regions in the display region, the method including the steps of:

forming a gate metal layer on a primary surface of the substrate, wherein the gate metal layer includes a gate electrode of the second TFT and a plurality of gate bus lines;

forming a lower insulating layer that covers the gate metal layer;

forming, on the lower insulating layer, a first oxide semiconductor layer to be an active layer of the at least one first TFT and a second oxide semiconductor layer to be an active layer of the second TFT;

forming an insulating film and a conductive film in this order covering the first oxide semiconductor layer and the second oxide semiconductor layer, patterning the conductive film, and patterning the insulating film by using the patterned conductive film as a mask or by using a mask that has been used when patterning the conductive film, thereby forming, from the insulating film, a gate insulating layer on a portion of the first oxide semiconductor layer and an island-shaped insulator layer on a portion of the second oxide semiconductor layer, and forming, from the conductive film, an upper gate electrode on the gate insulating layer and an island-shaped conductor layer on the island-shaped insulator layer, wherein the island-shaped conductor layer is electrically separated from the gate electrode of the second TFT;

performing a resistance lowering process for the first oxide semiconductor layer and the second oxide semiconductor layer by using the upper gate electrode and the island-shaped conductor layer as a mask;

forming an upper insulating layer that covers the upper gate electrode, the island-shaped conductor layer, the first oxide semiconductor layer and the second oxide semiconductor layer; and forming a source metal layer on the upper insulating layer, wherein the source metal layer includes source electrodes of the at least one first TFT and the second TFT, and a plurality of source bus lines that extend so as to cross the plurality of gate bus lines with the lower insulating layer and the upper insulating layer interposed therebetween.

[Item 18] The method for manufacturing an active matrix substrate according to Item 17, wherein the island-shaped conductor layer is electrically floating.

[Item 19] A method for manufacturing an active matrix substrate having a display region including a plurality of pixel regions and a non-display region provided around the display region, wherein the active matrix substrate includes a peripheral circuit that is arranged in the non-display region and includes at least one first TFT, and a second TFT that is arranged for each of the plurality of pixel regions in the display region, the method including the steps of:

forming a gate metal layer on a primary surface of the substrate, wherein the gate metal layer includes a gate electrode of the second TFT and a plurality of gate bus lines;

forming a lower insulating layer that covers the gate metal layer;

forming, on the lower insulating layer, a first oxide semiconductor layer to be an active layer of the at least one first TFT and a second oxide semiconductor layer to be an active layer of the second TFT;

forming an insulating film covering the first oxide semiconductor layer and the second oxide semiconductor layer, and patterning the insulating film, thereby forming a gate insulating layer on a portion of the first oxide semiconductor layer and an island-shaped insulator layer on a portion of the second oxide semiconductor layer;

performing a resistance lowering process for the first oxide semiconductor layer and the second oxide semiconductor layer by using the gate insulating layer and the island-shaped insulator layer as a mask;

forming a conductive film so as to cover the first oxide semiconductor layer and the second oxide semiconductor layer, for which the resistance lowering process has been performed, and patterning the conductive film, thereby forming an upper gate electrode on the gate insulating layer and removing a portion of the conductive film that is located on the island-shaped insulator layer and the second oxide semiconductor layer;

forming an upper insulating layer that covers the upper gate electrode, the island-shaped insulating layer, the first oxide semiconductor layer and the second oxide semiconductor layer; and forming a source metal layer on the upper insulating layer, wherein the source metal layer includes source electrodes of the at least one first TFT and the second TFT, and a plurality of source bus lines that extend so as to cross the plurality of gate bus lines with the lower insulating layer and the upper insulating layer interposed therebetween.

[Item 20] A display device comprising an active matrix substrate according to any one of Items 1 to 16.

According to one embodiment of the present invention, there is provided an active matrix substrate including oxide semiconductor TFTs that have characteristics suitable for their respective applications, for use in pixels and for use in peripheral circuits, wherein it is possible to suppress the increase in parasitic capacitance.

DETAILED DESCRIPTION

Figure 1:
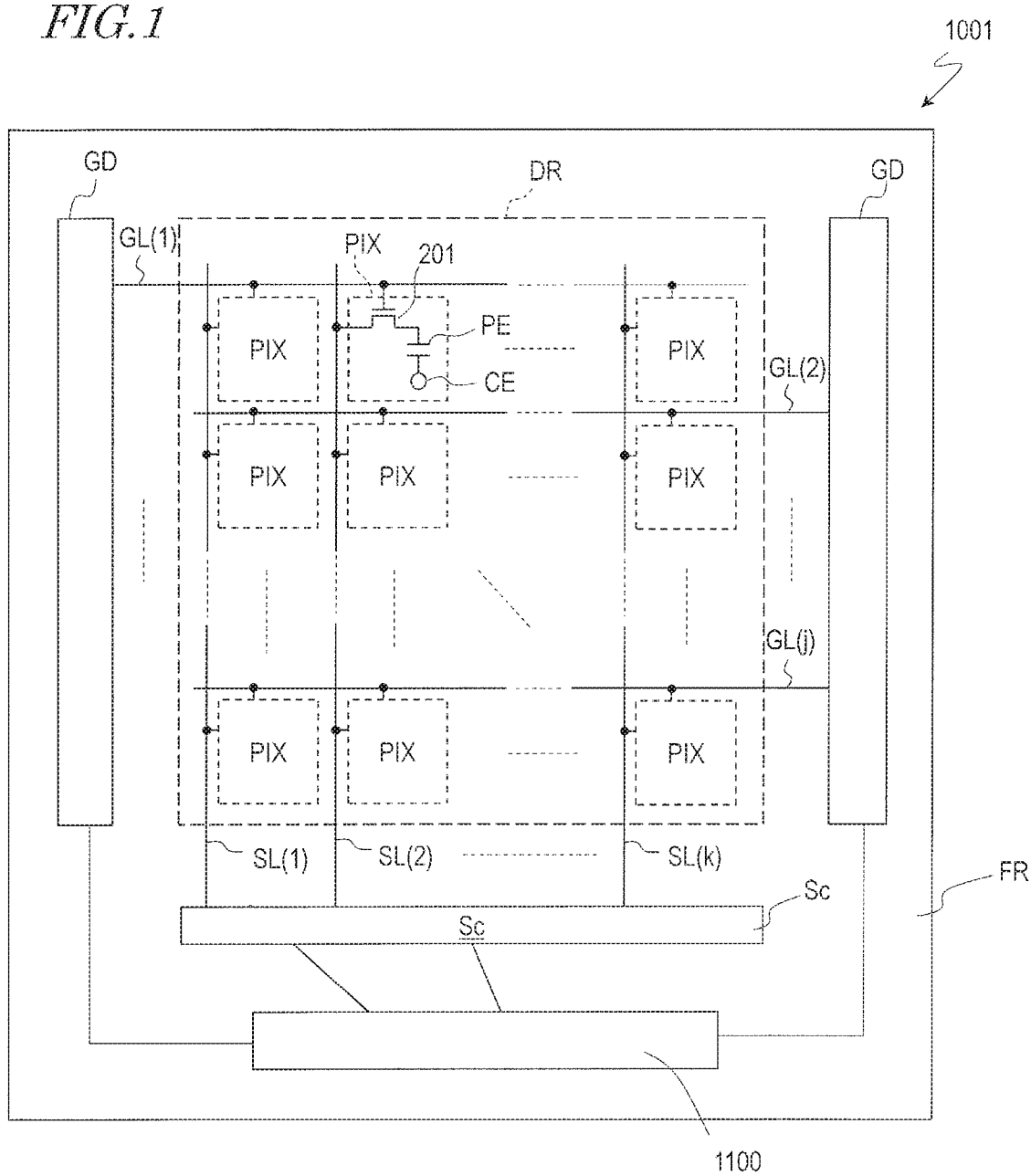
FIG. 1 is a schematic diagram showing an example of a planar structure of an active matrix substrate 1001 of the first embodiment.

On an active matrix substrate, circuit TFTs of a peripheral circuit are used for charging a larger capacity (bus line capacity) than pixel TFTs. In order to reduce the circuit area and reduce the area of the non-display region (a narrower bezel), it is preferred to keep the size of circuit TFTs small. Therefore, circuit TFTs are required to have a high current supplying capacity.

In view of this, the present inventors studied a configuration where top gate structure TFTs (or double gate structure TFTs) are used as circuit TFTs. Note that in the present specification, "double gate structure" refers to a structure where the gate electrode is arranged both on the substrate side, and on the side opposite to the substrate, of the oxide semiconductor layer being the active layer, "bottom gate structure" refers to a structure where the gate electrode is arranged only on the substrate side of the oxide semiconductor layer, and "top gate structure" refers to a structure where the gate electrode is arranged only on the side opposite to the substrate of the oxide semiconductor layer.

A top gate structure TFT can realize a higher current supplying capacity (high ON current) than a bottom gate structure TFT for the following reason. With a bottom gate structure TFT, the gate insulating layer needs to have a predetermined thickness since it is formed so as to cover a thick gate metal layer and is also responsible for avoiding short-circuiting between the gate bus line and the source bus line. In contrast, with a top gate structure TFT, the gate insulating layer only needs to cover the active layer (oxide semiconductor layer). Therefore, the gate insulating layer can be made thin and it is possible to increase the ON current. By further providing the gate electrode (lower gate electrode) on the substrate side of the oxide semiconductor layer of the top gate structure TFT (double gate structure TFT), it is possible to further improve the current supplying capacity and stabilize the OFF characteristics.

As described above, in view of the manufacturing process, it is preferred that pixel TFTs and circuit TFTs have the same TFT structure. However, when a top gate structure TFT is used as the pixel TFT, the capacitance Cgs between the source bus line and the gate bus line will be high. This is because, as will be later described in detail with reference to FIG. 17, when gate electrodes of pixel TFTs (top gate structure TFTs) and gate bus lines are formed in the same conductive layer (gate metal layer) and source electrodes are formed in the same conductive layer (source metal layer) as source bus lines, the insulating layer interposed between gate bus lines and source bus lines will be thin.

When TFTs having the same structure as circuit TFTs are formed as pixel TFTs, it may not be possible to realize characteristics demanded for pixel TFTs. Pixel TFTs for charging pixel electrodes are not normally required to have a charging ability as high as that of circuit TFTs since the pixel capacitance is low. Note however that there is a need to retain the pixel potential during the gate OFF period, and there is therefore a demand for superior OFF characteristics, meaning that the OFF current (the current when the gate low potential is selected) is low.

As described above, it has conventionally been difficult to form pixel TFTs and circuit TFTs that can each have characteristics demanded for their respective applications thereof by using the same oxide semiconductor film without complicating the manufacturing process or increasing the parasitic capacitance.

The present inventors made an in-depth study based on these findings to arrive at the present invention by discovering a configuration of an active matrix substrate that realizes characteristics that are demanded respectively for circuit TFTs and pixel TFTs, by using top gate structure TFTs or double gate structure TFTS as circuit TFTs and using bottom gate structure TFTs as pixel TFTs, and that can reduce the capacitance between source bus lines and gate bus lines.

First Embodiment

An active matrix substrate of the first embodiment will now be described with reference to the drawings. An active matrix substrate on which gate driver and source switching (Source Shared driving: SSD) circuits are formed monolithically will be described below as an example. Note that there is no limitation on the active matrix substrate of the present embodiment as long as it has a peripheral circuit that includes at least one circuit TFT monolithically formed thereon.

FIG. 1 is a schematic diagram showing an example of a planar structure of an active matrix substrate 1001 of the present embodiment.

The active matrix substrate 1001 includes a display region DR and a region (non-display region or bezel region) FR other than the display region DR. The display region DR includes pixel regions PIX that are arranged in a matrix pattern. The pixel region PIX (which may be referred to simply as a "pixel") is a region corresponding to a pixel of the display device. The non-display region FR is a region that is located around the display region DR and does not contribute to display.

The display region DR includes a plurality of gate bus lines GL(1) to GL(j) (j is an integer of two or more; they will hereinafter be referred to collectively as the "gate bus line GL") extending in the x direction (which may be referred to as the row direction or the second direction), and a plurality of source bus lines SL(1) to SL(k) (k is an integer of two or more; they will hereinafter be referred to collectively as the "source bus line SL") extending in the y direction (which may be referred to as the column direction or the first direction). Each pixel region PIX is defined by a gate bus line GL and a source bus line SL, for example.

Each pixel region PIX includes a thin film transistor (pixel TFT) 201 and a pixel electrode PE. The thin film transistor 201 includes an upper gate electrode and a lower gate electrode (not shown). These gate electrodes are each electrically connected to the corresponding gate bus line GL. The source electrode of the thin film transistor 201 is electrically connected to the corresponding source bus line SL, and the drain electrode is electrically connected to the pixel electrode PE. When an active matrix substrate is applied to a display device of a transverse electric field mode such as the FFS (Fringe Field Switching) mode, an electrode (common electrode) CE that is common for a plurality of pixels is provided on the active matrix substrate. When an active matrix substrate is applied to a display device of a vertical electric field mode, the common electrode CE is provided on the counter substrate, which is arranged so as to oppose the active matrix substrate with the liquid crystal layer interposed therebetween.

A gate driver GD for driving gate bus lines GL, for example, is provided integrally (monolithically) in the non-display region FR. The gate bus lines GL are connected to the respective terminals of the gate driver GD. The SSD circuit Sc for driving source bus lines SL in a time-division manner is integrally provided in the non-display region FR. The source bus lines SL are connected to the respective terminals of the SSD circuit Sc.

In this example, a driver IC 1100 including a source driver, a timing controller, etc., is mounted on the active matrix substrate 1001. Signals are supplied to the gate driver GD and the SSD circuit Sc from the driver IC 1100.

The SSD circuit is a circuit for distributing video data from a single video signal line from each terminal of the source driver to a plurality of source bus lines. With the provision of the SSD circuit, the region of the non-display region FR where the terminal portion is arranged (the terminal portion formation region) can be further reduced. The number of outputs from the source driver is reduced and the circuit scale can be decreased, and it is therefore possible to reduce the cost of the driver IC 1100.

As described above, peripheral circuits including a plurality of TFTs (circuit TFTs), such as the gate driver GD and the SSD circuit Sc, are formed in the non-display region FR of the active matrix substrate 1001. Some or all of the plurality of circuit TFTs are oxide semiconductor TFTs having the top gate structure or the double gate structure (hereinafter referred to as "first TFTs"). On the other hand, a pixel TFT is arranged in each pixel region PIX of the display region DR. Pixel TFTs are oxide semiconductor TFTs of the bottom gate structure formed by using the same oxide semiconductor film as the first TFTs (hereinafter referred to as "second TFTs").

The structure of the peripheral circuit and the pixel region PIX will be described in detail by using an active matrix substrate applied to a liquid crystal display device of an FFS mode as an example. Note that in the description hereinbelow, elements of substantially the same function will be denoted by like reference numerals and may not be further described below.

<Peripheral Circuit and First TFT>

A peripheral circuits including first TFTs may be a circuit that is monolithically formed on the active matrix substrate 1001, and may be the gate driver GD, the SSD circuit Sc, or another circuit. A known circuit may be used as a peripheral circuit.

Figure 2:
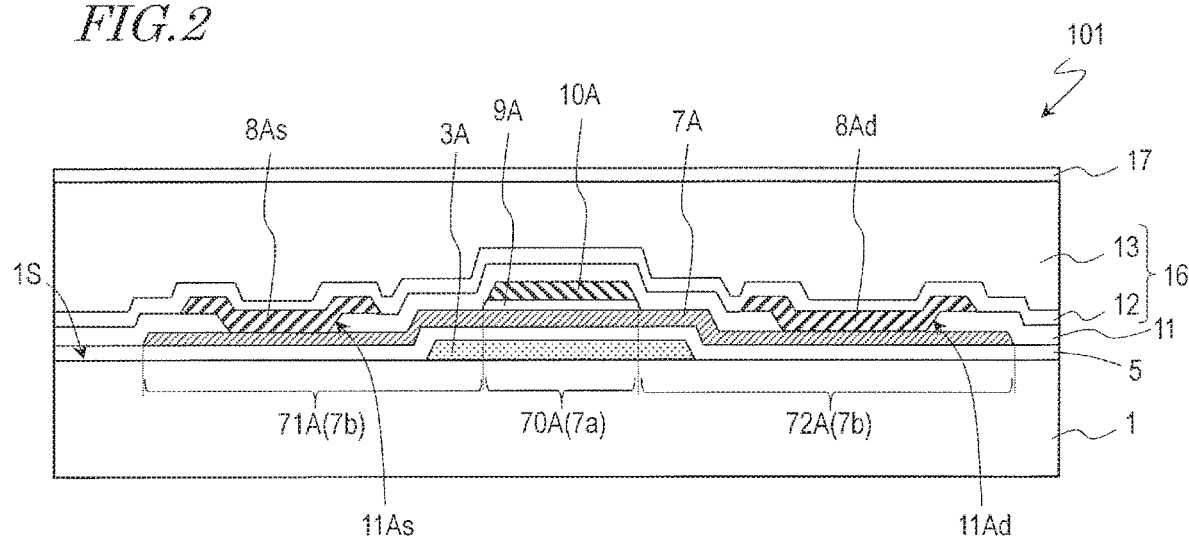
FIG. 2 is a schematic cross-sectional view showing a first TFT 101 of a peripheral circuit of the active matrix substrate 1001.

FIG. 2 is a schematic cross-sectional view showing a first TFT 101 of a peripheral circuit.

The peripheral circuit including the first TFT 101 is supported on a primary surface 1S of a substrate 1. The first TFT 101 includes a first oxide semiconductor layer 7A that includes a channel region 70A, an upper gate electrode 10A that is arranged over a portion of the first oxide semiconductor layer 7A with a gate insulating layer 9A interposed therebetween, and a first source electrode 8As and a first drain electrode 8Ad.

It may further include a lower conductive layer 3A that is arranged on the substrate 1 side of the first oxide semiconductor layer 7A with a lower insulating layer 5 interposed therebetween. The lower conductive layer 3A is arranged so as to at least partially overlap with the channel region 70A, as seen from the normal direction to the primary surface 1S of the substrate 1, and can function as a light-blocking film that blocks light traveling from the backlight side toward the channel region 70A.

The first TFT 101 may be a double gate structure TFT. In this case, the lower conductive layer 3A functions as the gate electrode (the first lower gate electrode), as well as as a light-blocking film, and the gate signal is input to both of the upper gate electrode 10A and the lower conductive layer (the first lower gate electrode) 3A, which are arranged with the first oxide semiconductor layer 7A interposed therebetween. Although not shown in the figure, there may be provided a contact portion that electrically connects together the lower conductive layer 3A and the upper gate electrode 10A.

Alternatively, the first TFT 101 may be a top gate structure TFT. In such a case, the gate signal is input to the upper gate electrode 10A but the gate signal is not input to the lower conductive layer 3A. That is, the lower conductive layer 3A does not function as the gate electrode. The lower conductive layer 3A may be a floating layer that is electrically floating or may be connected to a fixed potential.

Note that the active matrix substrate 1001 may include a plurality of first TFTs 101. Some of the first TFTs 101 may be top gate structure TFTs and some others thereof may be double gate structure TFTs.

The side surfaces of the upper gate electrode 10A and the gate insulating layer 9A may be aligned with each other. That is, the outer edges of the upper gate electrode 10A and the gate insulating layer 9A may be aligned with each other, as seen from the normal direction to the primary surface 1S of the substrate 1. Such a configuration is obtained by patterning the upper gate electrode 10A and the gate insulating layer 9A using the same mask, for example.

The gate insulating layer 9A and the upper gate electrode 10A may extend so as to pass over a portion of the first oxide semiconductor layer 7A in the channel width direction, for example. In this case, the lower surface of the gate insulating layer 9A may be in direct contact with the first oxide semiconductor layer 7Aa and the lower insulating layer 5.

As seen from the normal direction to the primary surface 1S of the substrate 1, a portion 7b of the first oxide semiconductor layer 7A that does not overlap with the gate insulating layer 9A (in this example, a portion that does not overlap with the upper gate electrode 10A and the gate insulating layer 9A) is a low resistance region that has a lower specific resistance than a portion 7a thereof that overlaps with the gate insulating layer 9A (and the upper gate electrode 10A). The low resistance region 7b can be formed by performing a resistance lowering process for the first oxide semiconductor layer 7A while using the upper gate electrode 10A and the gate insulating layer 9A as a mask, for example. The portion 7a that is masked by the upper gate electrode 10A and the gate insulating layer 9A and whose resistance is not lowered is referred to as the "first semiconductor region". In the first TFT 101, the first semiconductor region 7a becomes the channel region 70A where the channel of the first TFT 101 is formed. The low resistance region 7b includes a first region 71A and a second region 72A that are located on opposite sides of the channel region 70A.

An upper insulating layer 11 is arranged on the first oxide semiconductor layer 7A, the gate insulating layer 9A and the upper gate electrode 10A. The first source electrode 8As is arranged on the upper insulating layer 11 and in an opening (first source-side opening) 11As formed in the upper insulating layer 11, and is electrically connected to a portion of the first oxide semiconductor layer 7A (in this example, a portion of the first region 71A) in the source-side opening 11As. Similarly, the first drain electrode 8Ad is arranged on the upper insulating layer 11 and in an opening (first drain-side opening) 11Ad formed in the upper insulating layer 11, and is electrically connected to another portion of the first oxide semiconductor layer 7A (in this example, a portion of the second region 72A) in the drain-side opening 11Ad. The first source electrode 8As and the first drain electrode 8Ad may each be in direct contact with the first oxide semiconductor layer 7A.

The first TFT 101 may be covered by an interlayer insulating layer 16. For example, the interlayer insulating layer 16 may have a layered structure including an inorganic insulating layer 12 and an organic insulating layer 13 that is arranged on the inorganic insulating layer 12. A dielectric layer 17 may be arranged on the interlayer insulating layer 16. Although not shown in the figure, a transparent conductive layer may be provided as a shield layer on the dielectric layer 17 or between the dielectric layer 17 and the interlayer insulating layer 16. The transparent conductive layer that functions as a shield layer may be formed from the same transparent conductive film as the pixel electrode or the common electrode.

<Pixel Region PIX and Second TFT>

Figure 3:
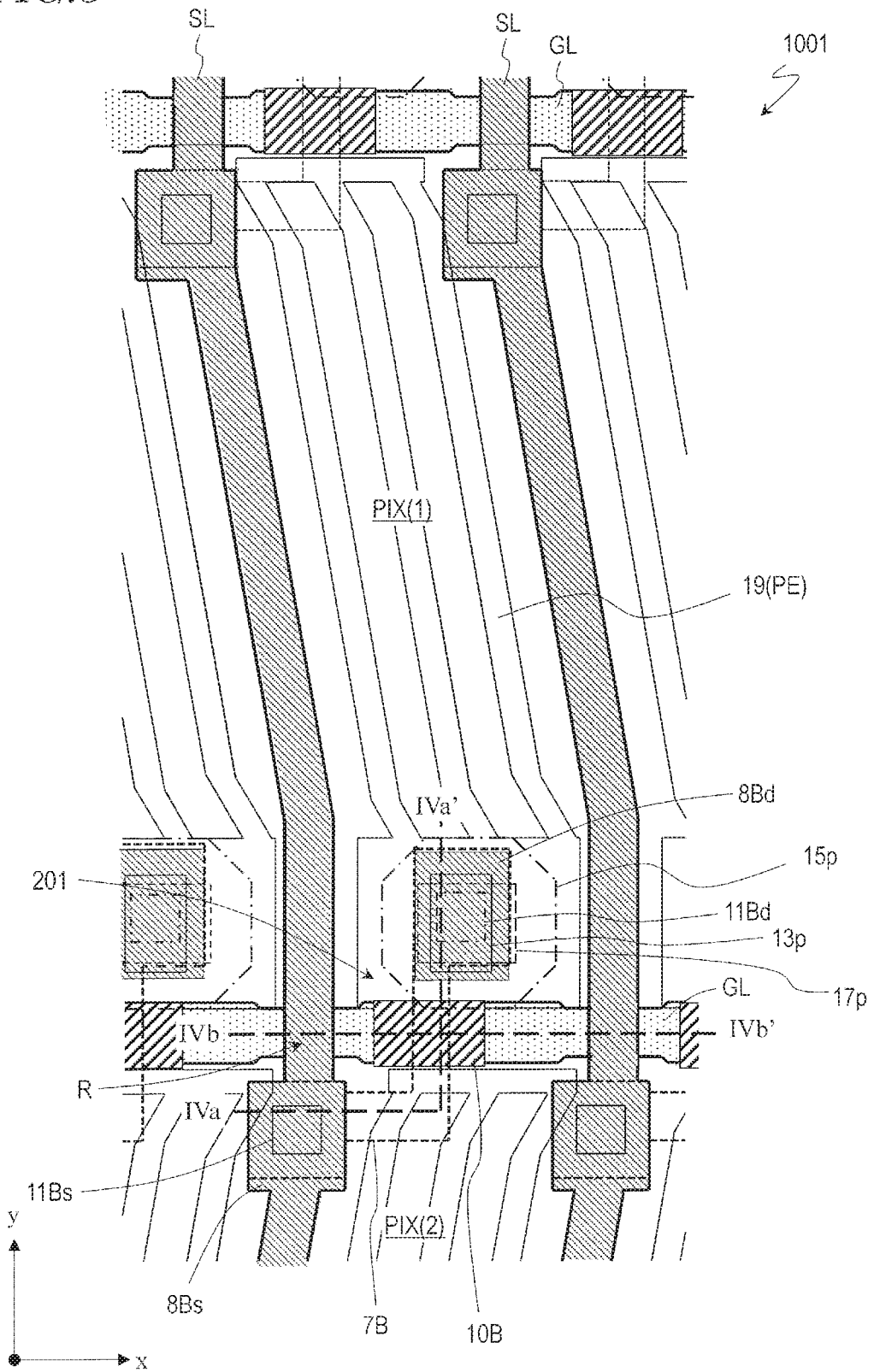
FIG. 3 is a plan view illustrating a pixel region PIX of the active matrix substrate 1001.
Figure 4A:
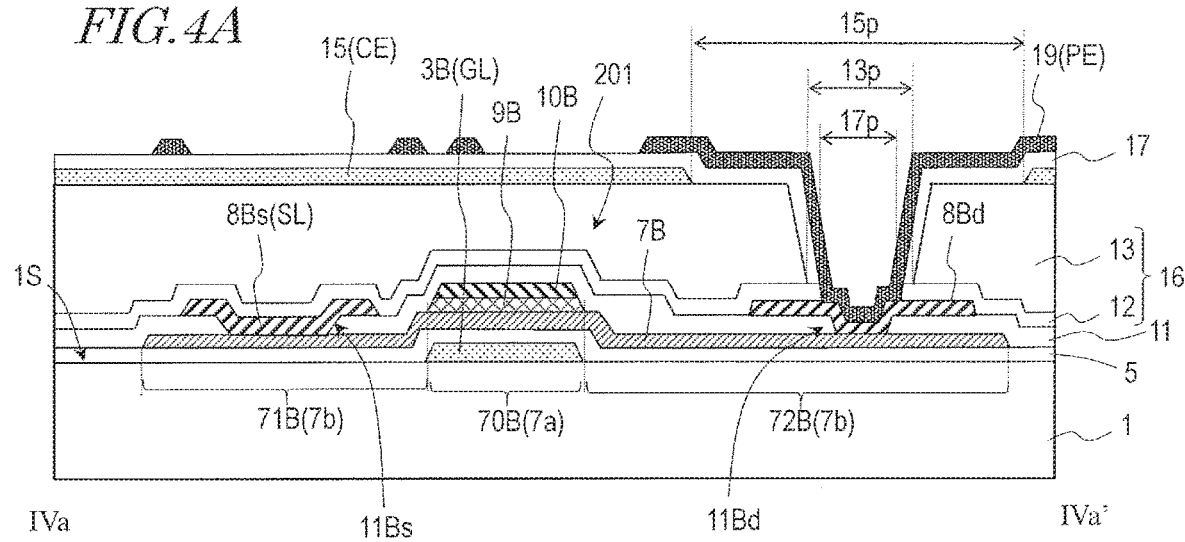
FIG. 4A is a schematic cross-sectional view showing a second TFT 201 taken along line IVa-IVa' of FIG. 3.
Figure 4B:
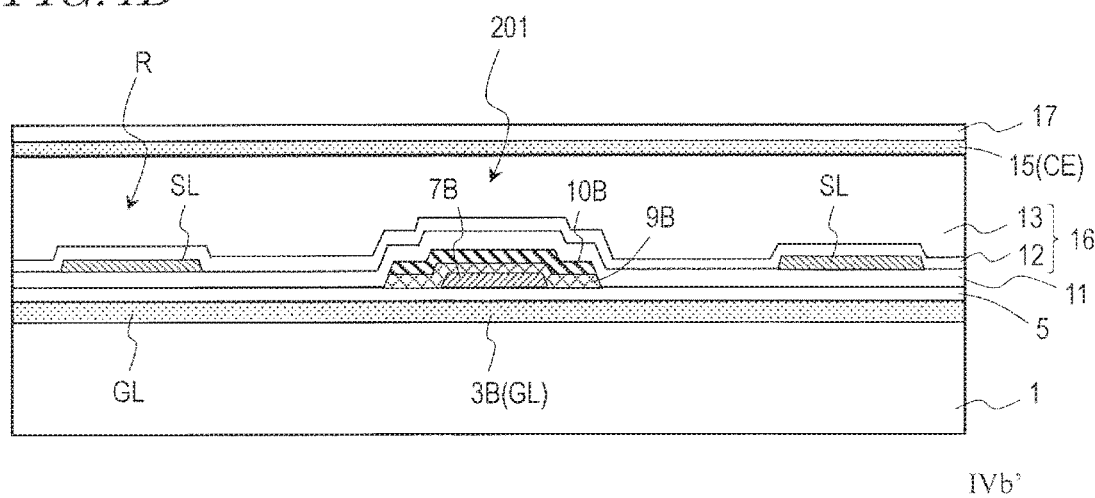
FIG. 4B is a schematic cross-sectional view showing the second TFT 201 and an intersection R taken along line IVb-IVb' of FIG. 3.

FIG. 3 is a plan view illustrating a pixel region PIX of the active matrix substrate 1001 of the present embodiment. FIG. 4A and FIG. 4B are schematic cross-sectional views taken along line IVa-IVa' and line IVb-IVb', respectively, of FIG. 3.

A pixel region PIX is a region that is surrounded by source bus lines SL extending in the y direction and gate bus lines GL extending in the x direction crossing the source bus lines SL.

The pixel region PIX includes the substrate 1, a second TFT (pixel TFT) 201 supported on the primary surface 1S of the substrate 1, a lower transparent electrode 15, and an upper transparent electrode 19. The upper transparent electrode 19 has a slit or a cutout portion for each pixel. In this example, the lower transparent electrode 15 is the common electrode CE, and the upper transparent electrode 19 is the pixel electrode PE.

The second TFT 201 is an oxide semiconductor TFT having the bottom gate structure. The second TFT 201 includes a second oxide semiconductor layer 7B, a lower gate electrode (which will be referred to also as a "second lower gate electrode") 3B that is arranged on the substrate 1 side of the second oxide semiconductor layer 7B with the lower insulating layer 5 interposed therebetween, and a second source electrode 8Bs and a second drain electrode 8Bd. The lower gate electrode 3B is electrically connected to the corresponding gate bus line GL, and the source electrode 8Bs is electrically connected to the corresponding source bus line SL. The drain electrode 8Bd is electrically connected to the pixel electrode PE.

An island-shaped conductor layer (which will be referred to also as a first island-shaped conductor layer) 10B is arranged over a portion of the second oxide semiconductor layer 7B with an island-shaped insulator layer (which will be referred to also as a first island-shaped insulating layer) 9B interposed therebetween. An island-shaped insulator layer 9B and an island-shaped conductor layer 10B are arranged so as to at least partially overlap with the lower gate electrode 3B, as seen from the normal direction to the primary surface 1S of the substrate 1. The island-shaped conductor layer 10B is a floating layer that is electrically floating (i.e., not electrically connected to any interconnect).

The second TFT 201 may be formed by using a layer (film) that is common for the first TFT 101 shown in FIG. 2. Specifically, the second oxide semiconductor layer 7B and the first oxide semiconductor layer 7A (FIG. 2) of the first TFT 101 are formed by using the same oxide semiconductor film. A plurality of source bus lines SL, the second source electrode 8Bs and the second drain electrode 8Bd, and the first source electrode 8As and the first drain electrode 8Ad (FIG. 2) in the first TFT 101 are formed by using the same conductive film (i.e., in the source metal layer). The gate bus line GL, the lower gate electrode 3B and the lower conductive layer 3A (FIG. 2) in the first TFT 101 are formed from the same conductive film (i.e., in the gate metal layer). Moreover, the island-shaped insulator layer 9B and the gate insulating layer 9A (FIG. 2) in the first TFT 101 are formed from the same insulating film, and the island-shaped conductor layer 10B and the upper gate electrode 10A (FIG. 2) in the first TFT 101 are formed from the same conductive film. The layer formed from the same conductive film as the upper gate electrode 10A will be referred to as the "upper metal layer".

The side surfaces of the island-shaped conductor layer 10B and the island-shaped insulator layer 9B may be aligned with each other. Such a configuration can be obtained for example by patterning the island-shaped conductor layer 10B and the island-shaped insulator layer 9B using the same mask.

The island-shaped insulator layer 9B and the island-shaped conductor layer 10B may extend so as to pass over a portion of the second oxide semiconductor layer 7B in the channel width direction, for example. In this case, the lower surface of the island-shaped insulator layer 9B may be in direct contact with the second oxide semiconductor layer 7B and the lower insulating layer 5.

Also in the second TFT 201, as in the first TFT 101, as seen from the normal direction to the primary surface 18 of the substrate 1, a portion 7b of the second oxide semiconductor layer 7B that does not overlap with the island-shaped insulator layer 9B (and the island-shaped conductor layer 10B) is a low resistance region that has a lower specific resistance than a portion (first semiconductor region) 7a thereof that overlaps with the island-shaped insulator layer 9B (and the island-shaped conductor layer 10B). The low resistance region 7b includes a first region 71B and a second region 72B that are located on opposite sides of the first semiconductor region 7a. A portion 70B of the first semiconductor region 7a that overlaps with the lower gate electrode 3B, as seen from the normal direction to the primary surface 1S of the substrate 1, is the "channel region" where the channel of the TFT 201 is formed. In this example, the entire first semiconductor region 7a is a channel region 70B. Note that as will be described below, the first semiconductor region 7a may include, in addition to the channel region 70B, a third region (offset region) that does not overlap with the lower gate electrode 3B.

The upper insulating layer 11 is arranged over the second oxide semiconductor layer 7B, the island-shaped insulator layer 9B and the island-shaped conductor layer 10B. The second source electrode 8Bs is arranged on the upper insulating layer 11 and in an opening (second source-side opening) 11Bs formed in the upper insulating layer 11, and is electrically connected to a portion of the second oxide semiconductor layer 7B (in this example, a portion of the second region 71B) in the source-side opening 11Bs. Similarly, the second drain electrode 8Bd is arranged on the upper insulating layer 11 and in an opening (second drain-side opening) 11Bd formed in the upper insulating layer 11, and is electrically connected to another portion of the second oxide semiconductor layer 7B (in this example, a portion of the second region 72B) in the drain-side opening 11Bd. The second source electrode 8Bs and the second drain electrode 8Bd may each be in direct contact with the second oxide semiconductor layer 7B.

The second source electrode 8Bs of the second TFT 201 may be a portion of the corresponding source bus line SL or may be a protruding portion that protrudes in the x direction, for example, from the source bus line SL. The lower gate electrode 3B may be a portion of the corresponding gate bus line GL or may be a protruding portion that protrudes in the y direction, for example, from the gate bus line GL.

As shown in FIG. 3, the source bus lines SL each extend so as to cross a plurality of gate bus lines GL in the display region DR. Each portion R where one source bus line and one gate bus line intersects with each other is referred to as an "intersection". As shown in FIG. 4B, in the intersection R, the source bus line SL overlaps with the gate bus line GL with the lower insulating layer 5 and the upper insulating layer 11 interposed therebetween. Thus, since at least two insulating layers 5 and 11 are located between the source bus line SL and the gate bus line GL, it is possible to reduce the capacitance of the overlap between the gate bus line GL and the source bus line SL.

As is the first TFT 101, the TFT 201 may be covered by the interlayer insulating layer 16. The lower transparent electrode 15 is arranged on the interlayer insulating layer 16. The upper transparent electrode 19 is arranged over the lower transparent electrode 15 with the dielectric layer 17 interposed therebetween. One of the lower transparent electrode 15 and the upper transparent electrode 19 (herein, the upper transparent electrode 19) functions as the pixel electrode PE, and the other one (herein, the lower transparent electrode 15) functions as the common electrode CE. The pixel electrode PE is divided into sections corresponding to pixels. The common electrode CE does not need to be divided into sections corresponding to pixels.

The pixel electrode PE is electrically connected to the drain electrode 8Bd of the TFT 201. In this example, the pixel electrode PE is in contact with the second drain electrode 8Bd in the pixel contact hole formed in the interlayer insulating layer 16 and the dielectric layer 17. The pixel contact hole may include, for example, an opening 13p formed in the organic insulating layer 13, and an opening 17p formed in the dielectric layer 17 and the inorganic insulating layer 12. The pixel contact hole may overlap partially or entirely with the drain-side opening 11Bd.

The common electrode CE may have an opening 15p over a region where the pixel contact hole of the TFT 201 is formed, and may be formed over the entire pixel region PIX except for this region.

As shown in FIG. 3, in the active matrix substrate 1001, the TFT 201 may be arranged so that the channel length direction is the y direction (the direction in which the source bus line SL extends) (vertical TFT arrangement). Note that the TFT 201 may be arranged so that the channel length direction is the x direction (horizontal TFT arrangement) as will be described later. In the present specification, the channel length direction refers to the direction in which the current flows through the channel region in a plane that is parallel to the primary surface 1S of the substrate 1, and the channel width direction refers to the direction that is perpendicular to the channel length direction.

In the example shown in FIG. 3, as seen from the normal direction to the primary surface 1S of the substrate 1, the second oxide semiconductor layer 7B of the second TFT 201 extends from another pixel region PIX(2) that is adjacent in the y direction to the pixel region PIX(1) across the gate bus line GL. The channel region 70B is formed in a portion of the second oxide semiconductor layer 7B that overlaps with the gate bus line GL. That is, a portion of the gate bus line GL that overlaps with the second oxide semiconductor layer 7B functions as the lower gate electrode 3B. The first region 71B of the second oxide semiconductor layer 7B overlaps with a portion of the source bus line SL in the other pixel region PIX(2), and is connected to the source bus line SL in the source-side opening 11Bs arranged in the overlap portion. That is, a portion of the source bus line SL that overlaps with the second oxide semiconductor layer 7B functions as the source electrode 8Bs. On the other hand, the second region 72B is connected to the drain electrode 8Bd in the pixel region PIX(1).

Although not shown in the figures, the second TFT 201 does not need to have the drain electrode 8Bd in the source metal layer. In such a case, the pixel electrode PE may be electrically connected to the second oxide semiconductor layer 7B by bringing the pixel electrode PE into direct contact with the second region 72B of the second oxide semiconductor layer 7B in the pixel contact hole. Alternatively, the second region 72B, which is the low resistance region of the second oxide semiconductor layer 7B, can be used as the pixel electrode PE.

Advantageous Effects

The active matrix substrate 1001 of the present embodiment is configured as described above and therefore achieves advantageous effects as follows.

Using different structures for circuit TFTs and for pixel TFTs, it is possible to achieve both characteristics demanded for the TFTs. Specifically, the first TFT 101 of the top gate or double gate structure is used as the circuit TFT. With the first TFT 101, the gate insulating layer 9A to be the gate insulating layer can be made thin, and it is therefore possible to achieve a high current supplying ability. Thus, it is possible to reduce the circuit area and decrease the area of the non-display region FR (a narrower bezel). On the other hand, by using second TFTs 201 of the bottom gate structure as pixel TFTs, it is possible to achieve a superior OFF characteristic.

Since the first TFT 101 and the second TFT 201 are formed by using a common layer (film), it is possible to selectively produce these TFTs 101 and 201 without increasing the number of manufacturing steps.

Moreover, when the second TFT 201 is used as the pixel TFT, as compared with a case where a top gate structure TFT similar to the first TFT 101 is used, it is possible to reduce the capacitance Cgs between the source bus line SL and the gate bus line GL. As a result, it is possible to reduce the capacitance of these bus lines SL and GL in the display region DR, and it is therefore possible to further reduce the size and/or increase the stability of peripheral circuits provided in the non-display region FR.

The reason why it is possible to reduce the capacitance Cgs will now be described with reference to the drawings.

Figure 17A:
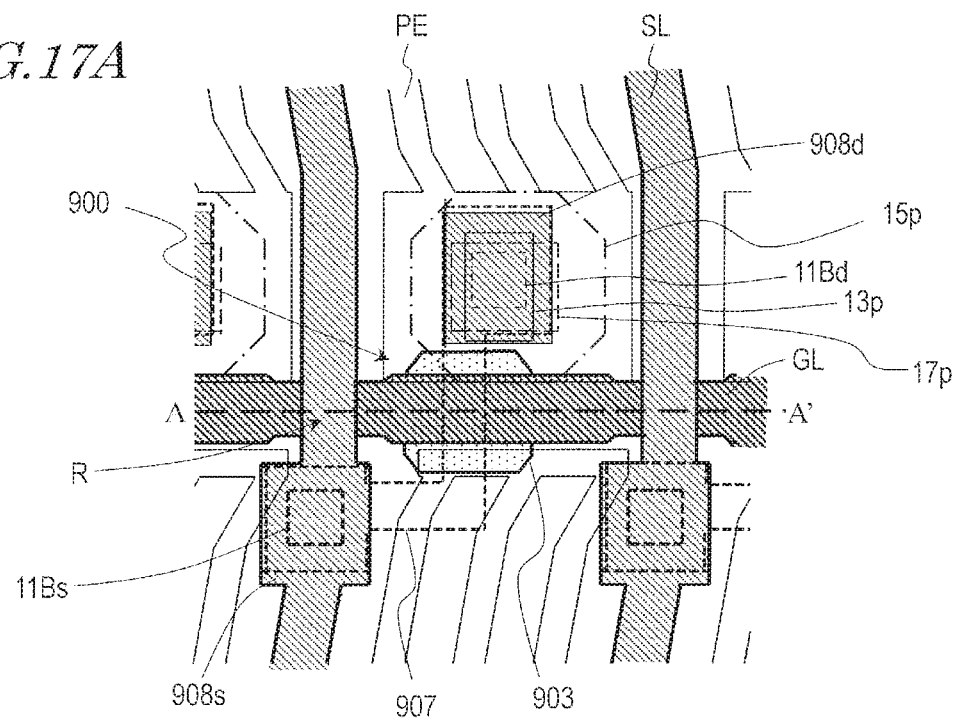
FIG. 17A is a plan view showing a portion of a pixel region PIX of an active matrix substrate of a reference example.
Figure 17B:
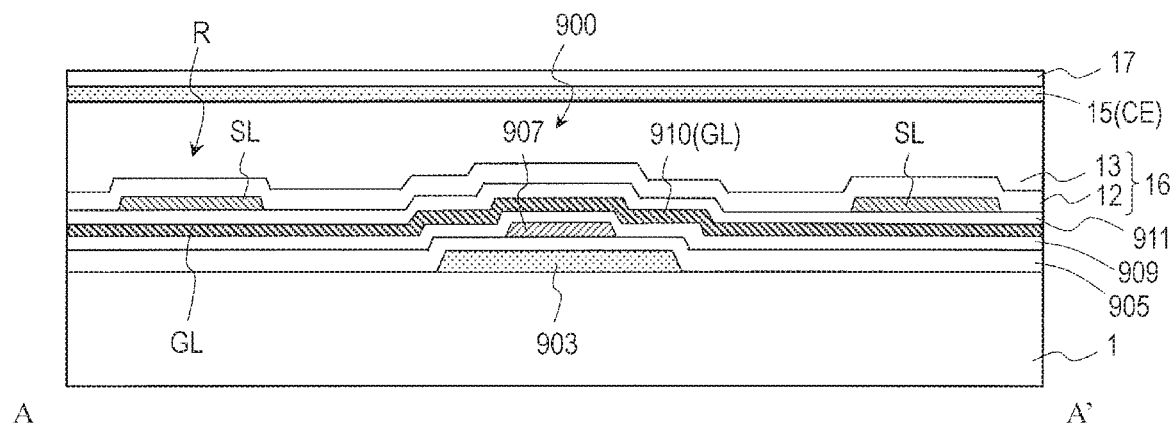
FIG. 17B is a cross-sectional view showing a portion of the pixel region PIX of the active matrix substrate of the reference example taken along line A-A' of FIG. 17A.

FIG. 17A and FIG. 17B are a plan view and a cross-sectional view taken along line A-A', respectively, showing a portion of a pixel region PIX on an active matrix substrate of a reference example. In FIG. 17A and FIG. 17B, like elements to those of FIG. 3, FIG. 4A and FIG. 4B are denoted by like reference numerals.

In the reference example, a top gate structure TFT similar to the first TFT 101 is used as the pixel TFT 900. The pixel TFT 900 includes an oxide semiconductor layer 907, a light-blocking layer 903 arranged on the substrate 1 side of the oxide semiconductor layer 907 with a lower insulating layer 905 interposed therebetween, a gate electrode 910 arranged over the oxide semiconductor layer 907 with a gate insulating layer 909 interposed therebetween, and a source electrode 908s and a drain electrode 908d. The source electrode 908s and the drain electrode 908d are arranged on an upper insulating layer 911 that covers the gate electrode 910. The source electrode 908s is formed in the source metal layer, and the gate electrode 910 is formed in the gate metal layer. Herein, the source electrode 908s is a part of the source bus line SL, and the gate electrode 910 is a part of the gate bus line GL.

In the reference example, only a single insulating layer (the upper insulating layer 911) is present between the gate metal layer and the source metal layer. Therefore, in the intersection R between the gate bus line GL and the source bus line SL, only the upper insulating layer 911 is located between these bus lines. Since there is a need to provide an opening in the upper insulating layer 911 for the connection between the oxide semiconductor layer 907 and source and drain electrodes 908s and 908d, a relatively thin inorganic insulating film such as a silicon nitride film or a silicon oxide film is normally used as the upper insulating layer 911. Therefore, it is difficult to reduce the capacitance Cgs between the gate bus line GL and the source bus line SL.

In contrast, with the active matrix substrate 1001 of the present embodiment, the second TFT 201 having the bottom gate structure is used as the pixel TFT, and the lower gate electrode 3B of the second TFT 201 and the gate bus line GL are formed in the same layer (gate metal layer). That is, the gate metal layer is located on the substrate 1 side relative to the second oxide semiconductor layer 7B, with the lower insulating layer 5 interposed therebetween. Therefore, in the intersection R, two layers, i.e., the lower insulating layer 5 and the upper insulating layer 11, are interposed between the gate bus line GL and the source bus line SL. Therefore, the thickness of the dielectric located between the gate bus line GL and the source bus line SL (the total thickness of the lower insulating layer 5 and the upper insulating layer 11) can be made larger as compared with the reference example, and it is possible to reduce the capacitance Cgs in the intersection R as compared with the reference example. For example, when the lower insulating layer 5 and the upper insulating layer 11 are formed from the same material and have the same thickness, the capacitance Cgs is reduced to about ½ as compared with the reference example.

The present embodiment is also advantageous in that there is no need to separately form a light-blocking layer for the pixel TFT.

When an oxide semiconductor TFT is used as the pixel TFT, when light of a particular wavelength is incident upon the channel region of the oxide semiconductor TFT, the OFF characteristics deteriorate due to an influence of an optically excited current, or the like, and it may be difficult to retain the pixel potential. Therefore, when a top gate structure TFT is used as the pixel TFT, there is a need to separately provide a light-blocking layer for blocking a portion of the backlight light coming from the back side of the active matrix substrate that travels toward the channel region, thereby increasing the number of manufacturing steps. When an electrically floating layer (the island-shaped light-blocking layer) is used as the light-blocking layer, the island-shaped light-blocking layer disadvantageously functions as the intermediate electrode that forms a capacitance with the gate (top gate). Therefore, there is a possibility for an increase in the source-gate capacitance (indirect capacitance between gate-island-shaped light-blocking layer-source) or an increase in the drain-gate capacitance (indirect capacitance between gate-island-shaped light-blocking layer-drain (pixel electrode)), which may lead to an increase in the bus line load, an increase in the pixel parasitic capacitance, etc.

In contrast, in the present embodiment, the lower gate electrode 3B functions also as the light-blocking layer, it is possible to prevent the increase in the number of manufacturing steps. Since there is no need to form the island-shaped light-blocking layer, there will not be such a capacitance increase as described above.

Figure 17C:
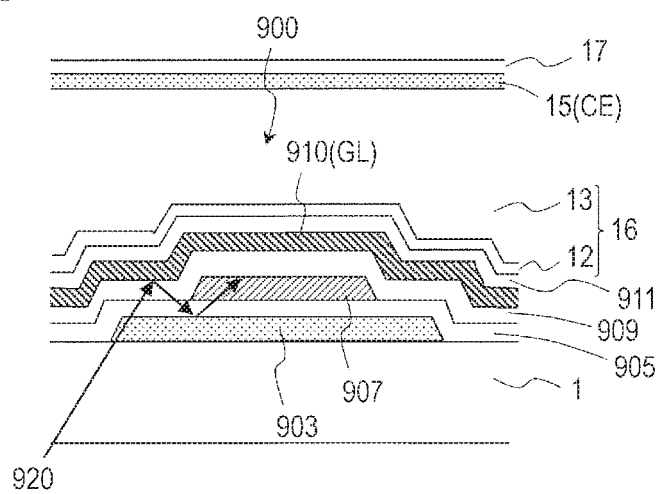
FIG. 17C is a schematic cross-sectional view illustrating multiple reflections of light of the active matrix substrate of the reference example.

Moreover, when a top gate structure TFT is used as the pixel TFT, it may not be possible to sufficiently prevent the backlight light from being incident upon the channel region even if a light-blocking layer is provided. For example, in the TFT 900 of the reference example, as shown in FIG. 17C, the light-blocking layer 903 having a larger width than the channel width is provided on the substrate 1 side of the oxide semiconductor layer 907. With this configuration, a portion of backlight light 920 may be incident upon the gate bus line GL coming from around the light-blocking layer 903 so as to repeatedly reflect between the lower surface of the gate bus line GL and the upper surface of the light-blocking layer 903 (multiple reflections), and the light may possibly be incident upon the channel region of the oxide semiconductor layer 907. Therefore, only with the light-blocking layer 903, it may not be possible to sufficiently prevent the deterioration of the TFT characteristics due to backlight light. If the size of the light-blocking layer 903 is increased in order to further reduce light to be incident upon the channel region, it may lead to other problems such as an increase in the indirect capacitance described above or a decrease in the pixel aperture ratio.

In contrast, in the present embodiment, the gate bus line GL and the lower gate electrode 3B are formed in the gate metal layer, which is located on the substrate 1 side of the channel region 70B, and the island-shaped conductor layer 10B is formed in the upper metal layer, which is formed on the channel region 70B. Since the island-shaped conductor layer 10B is used as a mask when lowering the resistance of a portion of the second oxide semiconductor layer 7B and is only required to cover a portion of the second oxide semiconductor layer 7B that forms the channel, it may have a size smaller than the size that is required when functioning as the channel shading layer (e.g., the size of the lower gate electrode 3B). When the width of the island-shaped conductor layer 10B is made smaller than the width of the lower gate electrode 3B and the gate bus line GL in the gate metal layer, backlight light coming from around the lower gate electrode 3B is less likely to be incident upon the island-shaped conductor layer 10B. Therefore, it is possible to prevent the backlight light from repeatedly reflect between the island-shaped conductor layer 10B and the gate metal layer to be incident upon the channel region 70B, and it is therefore possible to further stabilize the characteristics of the second TFT 201. This will now be described in detail with reference to the drawings.

Figure 5:
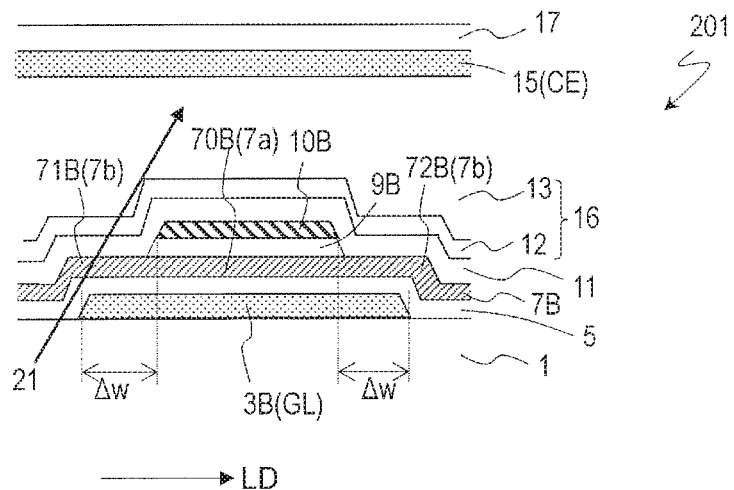
FIG. 5 is a schematic cross-sectional view taken along the channel length direction LD, showing another example of the second TFT 201 of the first embodiment.

FIG. 5 is a cross-sectional view taken along the channel length direction LD of the second TFT 201 (the y direction for the vertical TFT arrangement, the x direction for the horizontal TFT arrangement) according to the present embodiment.

As illustrated in FIG. 5, the island-shaped conductor layer 10B may be located inside the lower gate electrode 3B in the channel length direction LD of the second TFT 201, as seen from the normal direction to the primary surface 1S of the substrate 1. For example, the island-shaped conductor layer 10B may be located about 1 μm or more or about 2μ or more inside the edge of the lower gate electrode 3B ($\Delta w \geq 1$ μm or $\Delta w \geq 2$ μm). Then, backlight light 21 coming from around the lower gate electrode 3B is less likely to be directly incident upon the island-shaped conductor layer 10B, and it is therefore possible to prevent light from being incident upon the channel region 70B of the second oxide semiconductor layer 7B through multiple reflections.

The entirety of the island-shaped conductor layer 10B does not need to overlap with the lower gate electrode 3B, as seen from the normal direction to the primary surface 1S of the substrate 1. Preferably, the island-shaped conductor layer 10B is located inside the lower gate electrode 3B in any direction, as seen from the normal direction to the primary surface 1S of the substrate 1. Then, it is possible to more effectively prevent multiple reflections between the lower gate electrode 3B and the island-shaped conductor layer 10B.

Figure 6:
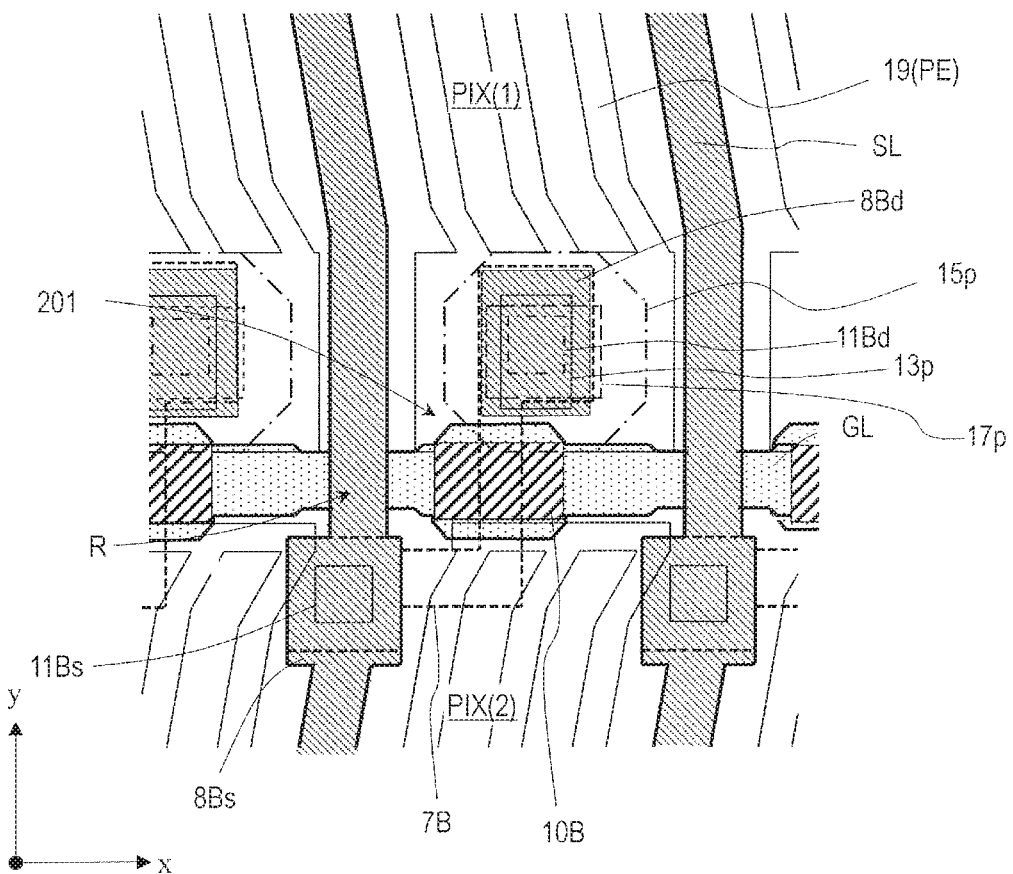
FIG. 6 is a schematic plan view showing another example of the second TFT 201 of the first embodiment.

FIG. 6 is a plan view showing still another example of the second TFT 201. As illustrated in FIG. 6, the width of the portion of the gate bus line GL that overlaps with the island-shaped conductor layer 10B may be larger than the width of the other portion of the gate bus line GL, as seen from the normal direction to the primary surface 1S of the substrate 1. Then, the island-shaped conductor layer 10B can be more reliably arranged inside the lower gate electrode 3B, as seen from the normal direction to the primary surface 1S of the substrate 1.

The active matrix substrate 1001 is applicable to a display device of an FFS mode or an IPS mode, for example. The FFS mode is a transverse electric field mode in which a pair of electrodes are provided on one substrate, and an electric field is applied through the liquid crystal molecules in the direction (transverse direction) parallel to the substrate surface. In this example, there is produced an electric field represented by lines of electric force that emerge from the pixel electrode PE, pass through the liquid crystal layer (not shown), and extend to the common electrode CE through the slit-shaped opening of the pixel electrode PE. This electric field has a component that is transverse with respect to the liquid crystal layer. As a result, it is possible to apply a transverse electric field through the liquid crystal layer. The transverse electric field scheme is advantageous in that liquid crystal molecules do not rise from the substrate, thereby realizing a wider viewing angle than the vertical electric field scheme.

An electrode structure in which the pixel electrode PE is arranged on the common electrode CE with the dielectric layer 17 interposed therebetween is described in International Publication WO2012/086513 pamphlet, for example. Note that the common electrode CE may be arranged on the pixel electrode PE with the dielectric layer 17 interposed therebetween. That is, the lower transparent electrode 15 formed on a lower transparent conductive layer may be the pixel electrode PE, and the upper transparent electrode 19 formed on an upper transparent conductive layer may be the common electrode CE. Such an electrode structure is described for example in Japanese Laid-Open Patent Publication No. 2008-032899 and Japanese Laid-Open Patent Publication No. 2010-008758. Disclosures of International Publication WO2012/086513 pamphlet, Japanese Laid-Open Patent Publication No. 2008-032899 and Japanese Laid-Open Patent Publication No. 2010-008758 are herein incorporated by reference in their entirety.

Note that the active matrix substrate of the present embodiment does not need to have the common electrode CE. Such an active matrix substrate can be used in a display device of a TN (Twisted Nematic) mode, VA (Vertical Alignment), etc. The VA mode and the TN mode are each a vertical electric field mode in which an electric field is applied through the liquid crystal molecules by means of a pair of electrodes arranged with the liquid crystal layer interposed therebetween.

The active matrix substrate 1001 is applicable to a display device (display panel) such as a liquid crystal display device, for example. A display panel includes the active matrix substrate 1001, a counter substrate arranged so as to oppose the active matrix substrate 1001, and a display medium layer provided between the active matrix substrate 1001 and the counter substrate. A backlight may be provided on the back side (the opposite side from the viewer side) of the active matrix substrate 1001. The display medium layer may be a liquid crystal layer, an organic EL layer, or the like.

<Method for Manufacturing Active Matrix Substrate 1001>

The first TFT 101 and the second TFT 201 of the present embodiment can be manufactured by a common process. By manufacturing second TFTs 201 utilizing the manufacturing step for first TFTs 101, it is possible to selectively produce first TFTs 101 and second TFTs 201 with no addition to manufacturing steps and photomasks.

Figure 7:
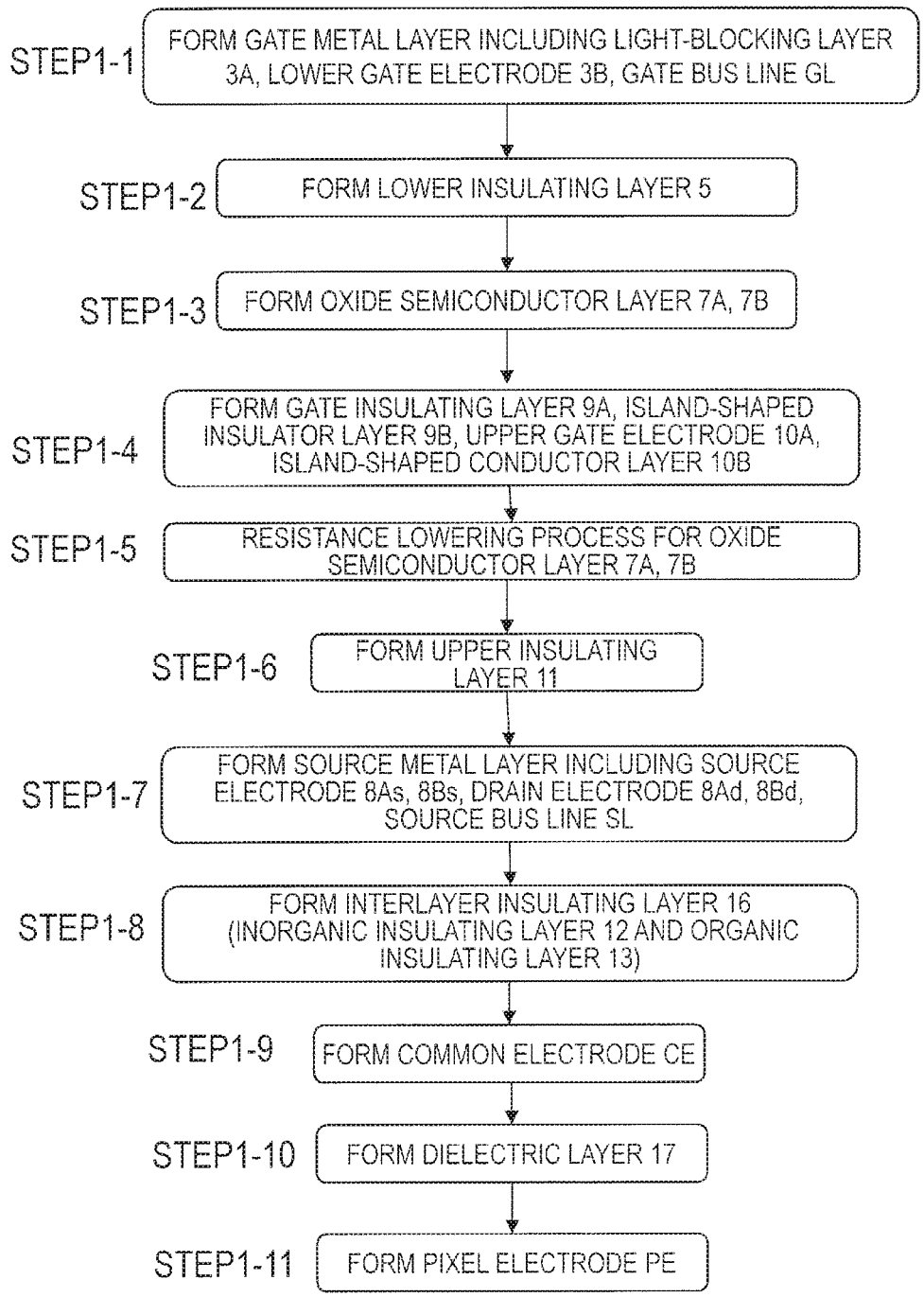
FIG. 7 is a flow chart showing an example of a method for manufacturing the active matrix substrate 1001.

Referring to FIGS. 2 to 4B and 7, an example of a method for manufacturing the active matrix substrate 1001 will now be described. FIG. 7 is a flow chart showing an example of a method for manufacturing the active matrix substrate 1001.

Step 1-1

First, a gate metal layer is formed on the substrate 1, wherein the gate metal layer includes the gate bus line GL, the lower conductive layer 3A of the first TFT 101 and the lower gate electrode 3B of the second TFT 201.

The substrate 1 may be, for example, a glass substrate, a silicon substrate, a heat-resistant plastic substrate (resin substrate), or the like.

The gate metal layer is obtained for example by forming a lower gate conductive film (thickness: 50 nm or more and 500 nm or less, for example) by a sputtering method, or the like, and patterning the lower gate conductive film.

The gate conductive film may be, for example, a metal film including an element selected from among aluminum (Al), chromium (Cr), copper (Cu), tantalum (Ta), titanium (Ti), molybdenum (Mo) and tungsten (W), or an alloy film including one or more of these elements as its components. It may be a layered film including a plurality of films of some of these elements. For example, it may be a layered film having a three-layer structure of titanium film aluminum film-titanium film, or a three-layer structure of molybdenum film-aluminum film-molybdenum film. Note that the lower gate conductive film is not limited to a three-layer structure, but may have a single-layer or two-layer structure or may have a layered structure of four or more layers. Herein, the lower gate conductive film is a layered film whose lower layer is a Ti film (thickness: 15 to 70 nm) and whose upper layer is a Cu film (thickness: 200 to 400 nm).

Step 1-2

Next, a lower insulating layer (thickness: 200 nm or more and 600 nm or less, for example) 5 that covers the gate metal layer is formed.

The lower insulating layer 5 may suitably be a silicon oxide ($SiO_2$) layer, a silicon nitride (SiNx) layer, a silicon oxide nitride (SiOxNy; x>y) layer, a silicon nitride oxide (SiNxOy; x>y) layer, an aluminum oxide layer, a tantalum oxide layer, or the like. The lower insulating layer 5 may have a layered structure. Herein, by using a CVD method, for example, a layered film whose lower layer is a silicon nitride (SiNx) layer (thickness: 50 to 600 nm) and whose upper layer is a silicon oxide ($SiO_2$) layer (thickness: 50 to 600 nm) is formed as the lower insulating layer 5. When an oxide film such as a silicon oxide film is used as the lower insulating layer 5 (as the uppermost layer thereof when the lower insulating layer 5 has a layered structure), the oxidation deficiency occurring in the channel region of the oxide semiconductor layer to be formed later can be reduced by the oxide film, and it is therefore possible to suppress a decrease in the resistance of the channel region.

Step 1-3

Next, an oxide semiconductor film (thickness: 15 nm or more and 200 nm or less, for example) is formed by using a sputtering method, for example, on the lower insulating layer 5, and the oxide semiconductor film is patterned, thereby forming the first oxide semiconductor layer 7A of the first TFT 101 and the second oxide semiconductor layer 7B of the second TFT 201. Although there is no particular limitation, the oxide semiconductor film may be an In—Ga—Zn—O-based semiconductor film, for example.

Step 1-4

Then, an insulating film (thickness: 80 nm or more and 250 nm or less, for example) and an upper gate conductive film (thickness: 50 nm or more and 500 nm or less, for example) are formed in this order so as to cover the first oxide semiconductor layer 7A and the second oxide semiconductor layer 7B. The upper gate conductive film can be formed by using a sputtering method, for example, and the insulating film can be formed by a CVD method, for example.

An insulating film similar to the lower insulating layer 5 (the insulating film illustrated above as the lower insulating layer 5) may be used as the insulating film. When an oxide film such as a silicon oxide film is used as the insulating film, it is possible to reduce the oxidation deficiency occurring in the channel region of the oxide semiconductor layer 7A, 7B by the oxide film, and it is therefore possible to suppress a decrease in the resistance of the channel region. A conductive film similar to the lower gate conductive film may be used as the upper gate conductive film. Herein, a silicon oxide ($SiO_2$) film is used, for example, as the insulating film. A layered film whose lower layer is a Ti film (thickness: 15 to 70 nm) and whose upper layer is a Cu film (thickness: 200 to 400 nm) is used, for example, as the upper gate conductive film.

Then, the upper gate conductive film is patterned by using the first resist mask (not shown), thereby forming the upper gate electrode 10A of the first TFT 101 and the island-shaped conductor layer 10B of the second TFT 201. The patterning of the upper gate conductive film can be performed by wet etching or dry etching.

Then, the insulating film is patterned by using the first resist mask. Alternatively, after the removal of the first resist mask, the insulating film may be patterned by using, as a mask, the upper gate electrode 10A and the island-shaped conductor layer 10B that have been patterned. Thus, the gate insulating layer 9A of the first TFT 101 and the island-shaped insulator layer 9B of the second TFT 201 are obtained. The patterning of the insulating film can be performed by dry etching, for example.

Note that when patterning the insulating film, the surface portion of a portion of the lower insulating layer 5 that is not covered by the first oxide semiconductor layer 7A and the second oxide semiconductor layer 7B may also be etched (overetch).

In this step, since the insulating film and the upper gate conductive film are patterned by using the same mask, the side surface of the gate insulating layer 9A and the side surface of the upper gate electrode 10A are aligned with each other in the thickness direction. Similarly, the side surface of the island-shaped insulator layer 9B and the side surface of the island-shaped conductor layer 10B are aligned with each other in the thickness direction. That is, as seen from the normal direction to the primary surface 1S of the substrate 1, the outer edges of the gate insulating layer 9A and the island-shaped insulator layer 9B are aligned respectively with the outer edge of the upper gate electrode 10A and the outer edge of the island-shaped conductor layer 10B.

Step 1-5

Then, a resistance lowering process for the first oxide semiconductor layer 7A and the second oxide semiconductor layer 7B is performed. For example, a plasma treatment may be performed as the resistance lowering process. Thus, as seen from the normal direction to the primary surface 1S of the substrate 1, the region 7b of the first oxide semiconductor layer 7A that does not overlap with the upper gate electrode 10A and the gate insulating layer 9A is a low resistance region that has a lower specific resistance than the region 7a that overlaps with the upper gate electrode 10A and the gate insulating layer 9A. Similarly, the region 7b of the second oxide semiconductor layer 7B that does not overlap with the island-shaped conductor layer 10B and the island-shaped insulator layer 9B is a low resistance region that has a lower specific resistance than the region 7a that overlaps with the island-shaped conductor layer 10B and the island-shaped insulator layer 9B. The low resistance region 7b may be a conductor region (sheet resistance: 200 Ω/square or less, for example).

In the resistance lowering process (plasma treatment), portions of the oxide semiconductor layers 7A and 7B that are not covered by the upper gate electrode 10A or the island-shaped conductor layer 10B may be exposed to a plasma that includes a reducing plasma or a doping element (e.g., an argon plasma). This lowers the resistance in the vicinity of the surface of the exposed portions of the oxide semiconductor layers 7A and 7B, producing the low resistance region 7b. Portions 7a of the oxide semiconductor layers 7A and 7B that are masked by the upper gate electrode 10A or the island-shaped conductor layer 10B remain as the first semiconductor region. Note that the method, the conditions, etc., of the resistance lowering process are described in Japanese Laid-Open Patent Publication No. 2008-40343, for example. The disclosure of Japanese Laid-Open Patent Publication No. 2008-40343 is herein incorporated by reference in its entirety.

Step 1-6

Next, the upper insulating layer 11 is formed that covers the upper gate electrode 10A, the island-shaped conductor layer 10B, the first oxide semiconductor layer 7A and the second oxide semiconductor layer 7B. The upper insulating layer 11 may be a single layer or a layered structure of an inorganic insulating layer such as a silicon oxide film, a silicon nitride film, a silicon oxide nitride film or a silicon nitride oxide film. The thickness of the inorganic insulating layer may be 100 nm or more and 500 nm or less. Forming the upper insulating layer 11 by using an insulating film that reduces an oxide semiconductor such as a silicon nitride film is preferable as it is then possible to maintain a low specific resistance of regions (herein, low resistance regions 7b) of the oxide semiconductor layers 7A and 7B that are in contact with the upper insulating layer 11. Herein, an SiNx layer (thickness: 300 nm) is formed by a CVD method, for example, as the upper insulating layer 11.

Then, openings 11As, 11Ad, 11Bs and 11Bd that reach the first oxide semiconductor layer 7A and the second oxide semiconductor layer 7B are formed in the upper insulating layer 11 by dry etching, for example.

Step 1-7

Next, a source metal layer including the source electrodes 8As and 8Bs, the drain electrodes 8Ad and 8Bd and the source bus line SL is formed on the upper insulating layer 11. Herein, a source conductive film (thickness: 50 nm or more and 500 nm or less, for example) is formed on the upper insulating layer 11 and in the openings 11As, 11Ad, 11Bs and 11Bd, and the source conductive film is patterned, thereby obtaining the source metal layer. The patterning may be performed by dry etching or wet etching. Thus, the first TFT 101 and the second TFT 201 are obtained.

The source conductive film may be, for example, a metal film including an element selected from among aluminum (Al), chromium (Cr), copper (Cu), tantalum (Ta), titanium (Ti), molybdenum (Mo) and tungsten (W), or an alloy including one or more of these elements as its components. For example, it may have a three-layer structure of titanium film-aluminum film-titanium film, a three-layer structure of molybdenum film-aluminum film-molybdenum film, or the like. Note that the source conductive film is not limited to a three-layer structure, but may have a single layer, a two-layer structure or a layered structure of four layers or more. Herein, a layered film is used whose lower layer is a Ti film (thickness: 15 to 70 nm) and whose upper layer is a Cu film (thickness: 200 to 400 nm).

Step 1-8

Then, the interlayer insulating layer 16 is formed so as to cover the first TFT 101, the second TFT 201 and the source bus line SL. Herein, as the interlayer insulating layer 16, an inorganic insulating layer (thickness: 100 nm or more and 400 nm or less, for example) 12 and an organic insulating layer (thickness: 1 to 3 µm, preferably 2 to 3 µm, for example) 13 are formed in this order. The material of the inorganic insulating layer 12 may be the same as the material that is illustrated above as the material of the upper insulating layer 11. Herein, an SiNx layer (thickness: 200 nm, for example) is formed by a CVD method as the inorganic insulating layer 12. The organic insulating layer 13 may be an organic insulating film including a photosensitive resin material, for example. Then, the organic insulating layer 13 is patterned to form the opening 13p.

Step 1-9

Then, the lower transparent electrode 15 to be the common electrode CE is formed.

First, a first transparent conductive film (thickness: 20 to 300 nm) is formed on the interlayer insulating layer 16 and in the opening 13p. Herein, an indium-zinc oxide film is formed as the first transparent conductive film by a sputtering method, for example. The material of the first transparent electrode film may be a metal oxide such as indium-tin oxide (ITO), indium-zinc oxide and ZnO. Then, the first transparent conductive film is patterned by wet etching, for example. Thus, the lower transparent electrode 15 is obtained. In this example, the lower transparent electrode 15 is arranged over substantially the entirety of the display region. Note however that the lower transparent electrode 15 has the opening 15p in the region where the pixel contact hole is formed. In this example, a portion of the first transparent conductive film that is located in the opening 13p is removed. Note that a shield layer that covers a part or whole of the peripheral circuit may be formed by using the first transparent conductive film.

Step 1-10

Then, a dielectric layer (thickness: 50 to 500 nm) 17 is formed on the interlayer insulating layer 16 and the lower transparent electrode 15 and in the opening 13p. The material of the dielectric layer 17 may be the same as the material that is illustrated above as the material of the inorganic insulating layer 12. Herein, an SiN film is formed by a CVD method, for example, as the dielectric layer 17.

Then, the dielectric layer 17 and the inorganic insulating layer 12 (a portion of the inorganic insulating layer 12 that is located in the opening 13p) are etched to form the opening 17p that reaches a portion of the second region 72B of the second oxide semiconductor layer 7B. The opening 17p may be arranged so as to at least partially overlap with the opening 13p, as seen from the normal direction to the primary surface 1S of the substrate 1. Thus, a pixel contact hole is obtained that includes the opening 13p of the organic insulating layer 13 and the opening 17p of the dielectric layer 17.

Step 1-11

Then, a second transparent conductive film (thickness: 20 to 300 nm) is formed on the dielectric layer 17 and in the pixel contact hole. Then, the second transparent conductive film is patterned so as to form the upper transparent electrode 19 that functions as the pixel electrode PE on the dielectric layer 17. The upper transparent electrode 19 is provided with at least one opening (or a cutout portion) for each pixel.

The material of the second transparent conductive film may be the same as the material that is illustrated above as the material of the first transparent conductive film. The second transparent conductive film may be a single layer or a layered film. Herein, an indium-zinc oxide film is formed by a sputtering method, for example. A portion of the upper transparent electrode 19 may be arranged so as to overlap with the lower transparent electrode 15 with the dielectric layer 17 interposed therebetween, thereby forming an auxiliary capacitor. Thus, the active matrix substrate 1001 is manufactured.

<Variation>

Figure 8:
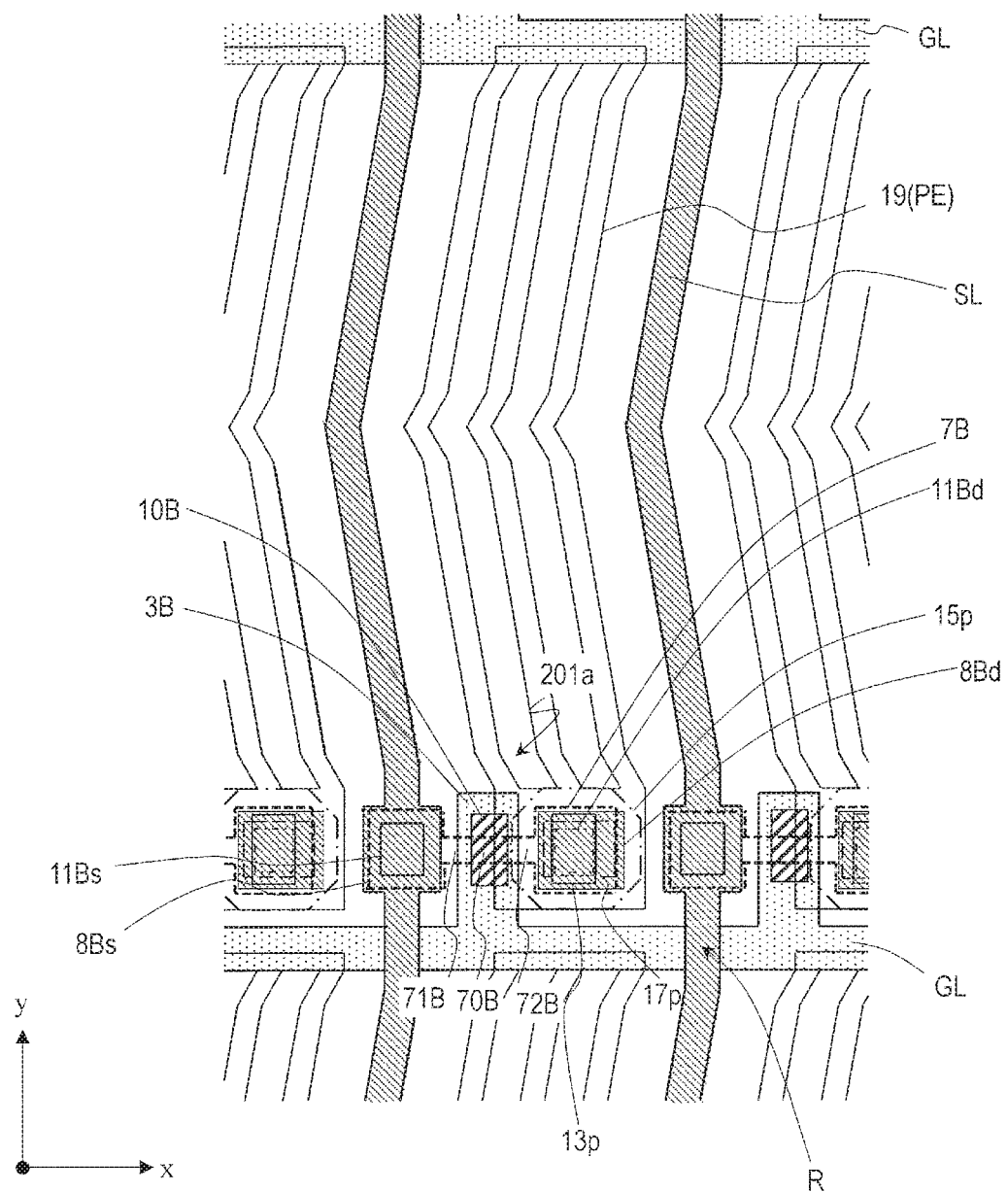
FIG. 8 is a plan view showing a pixel region PIX of another active matrix substrate of the first embodiment.

FIG. 8 is a plan view illustrating a pixel region PIX of another active matrix substrate of the present embodiment.

As shown in FIG. 8, the second TFT 201a, which is a pixel TFT, may be arranged in the corresponding pixel region PIX so that the channel length direction is the x direction (horizontal TFT arrangement). Herein, a portion of the source bus line SL functions as the second source electrode 8Bs. As seen from the normal direction to the primary surface 1S of the substrate 1, the gate bus line GL includes a main portion that extends in the x direction, and a protruding portion that protrudes from the main portion in the y direction, wherein the protruding portion functions as the lower gate electrode 3B. The second oxide semiconductor layer 7B may extend from above the source bus line SL so as to pass over the protruding portion of the gate bus line GL.

The island-shaped conductor layer 10B is arranged so as to at least partially overlap with the lower gate electrode 3B, as seen from the normal direction to the primary surface 1S of the substrate 1. The island-shaped conductor layer 10B may extend so as to pass over a portion of the second oxide semiconductor layer 7B in the y direction (channel width direction), as seen from the normal direction to the primary surface 1S of the substrate 1. In this example, the island-shaped conductor layer 10B is arranged inside the protruding portion of the gate bus line GL, as seen from the normal direction to the primary surface 1S of the substrate 1. Then, as described above, backlight light that comes into the panel from around the lower gate electrode 3B is less likely to be reflected/scattered by the island-shaped conductor layer 10B, and it is therefore possible to prevent the deterioration of the characteristics due to light entering the channel region.

Also in the second TFT 201a, as seen from the normal direction to the primary surface 1S of the substrate 1, the portion 7b of the second oxide semiconductor layer 7B that does not overlap with the island-shaped conductor layer 10B and the island-shaped insulator layer 9B is a low resistance region that has a lower specific resistance than the portion (first semiconductor region) 7a that overlaps with the island-shaped conductor layer 10B and the island-shaped insulator layer 9B. The portion 70B of the first semiconductor region 7a that overlaps with the lower gate electrode 3B as seen from the normal direction to the primary surface 1S of the substrate 1 is to be the channel region.

Figure 9:
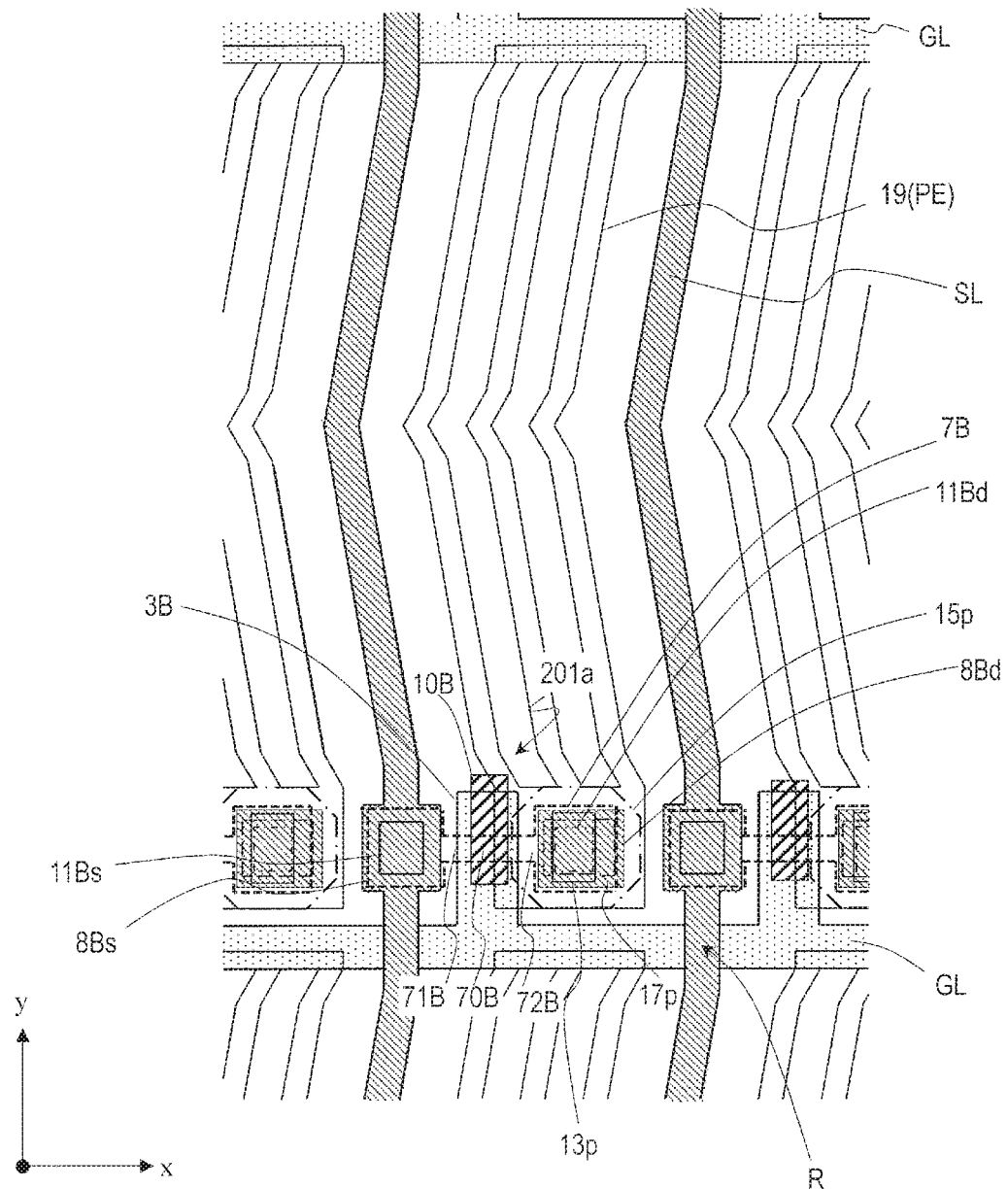
FIG. 9 is a plan view showing a pixel region PIX of still another active matrix substrate of the first embodiment.

Note that as seen from the normal direction to the primary surface 1S of the substrate 1, the entirety of the island-shaped conductor layer 10B overlaps with the lower gate electrode 3B in the example shown in FIG. 8, but only a portion of the island-shaped conductor layer 10B may overlap with the lower gate electrode 3B. For example, as shown in FIG. 9, the island-shaped conductor layer 10B may extend so as to pass over the channel region 70B of the second oxide semiconductor layer 7B and the edge of the protruding portion (a portion of the edge of the protruding portion that is located farthest away in the y direction from the main portion of the gate bus line GL) in the y direction. Also in this case, it is possible to prevent light from being incident upon the channel region through multiple reflections if the island-shaped conductor layer 10B is located inside (e.g., 1 μm or more inside) the lower gate electrode 3B in the channel length direction of the second TFT 201 (in this example, the x direction), as seen from the normal direction to the primary surface 1S of the substrate 1. Since a portion of the island-shaped conductor layer 10B that does not overlap with the lower gate electrode 3B is away from the channel region 70B, even if multiple reflections occur between the gate bus line GL and the island-shaped conductor layer 10B, the light is less likely to be incident upon the channel region 70B.

Second Embodiment

An active matrix substrate of the second embodiment of the present invention will now be described with reference to the drawings.

The present embodiment is different from the first embodiment in that the second TFT (pixel TFT) having the bottom gate structure do not include the island-shaped conductor layer 10B.

Figure 10:
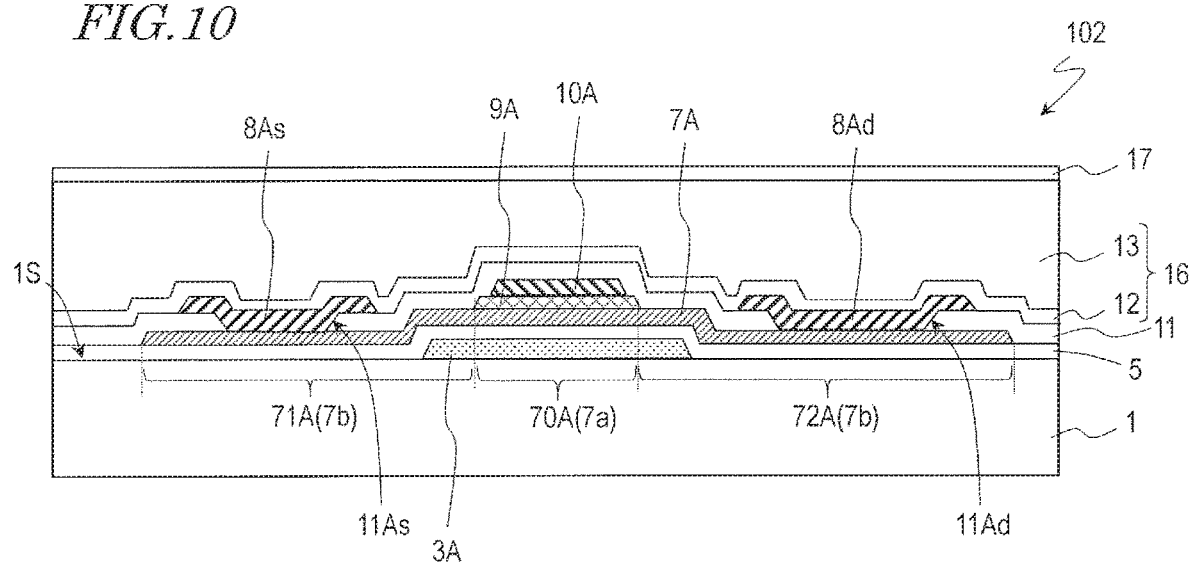
FIG. 10 is a schematic cross-sectional view showing a first TFT 102 of a peripheral circuit of an active matrix substrate 1002 of the second embodiment.
Figure 11:
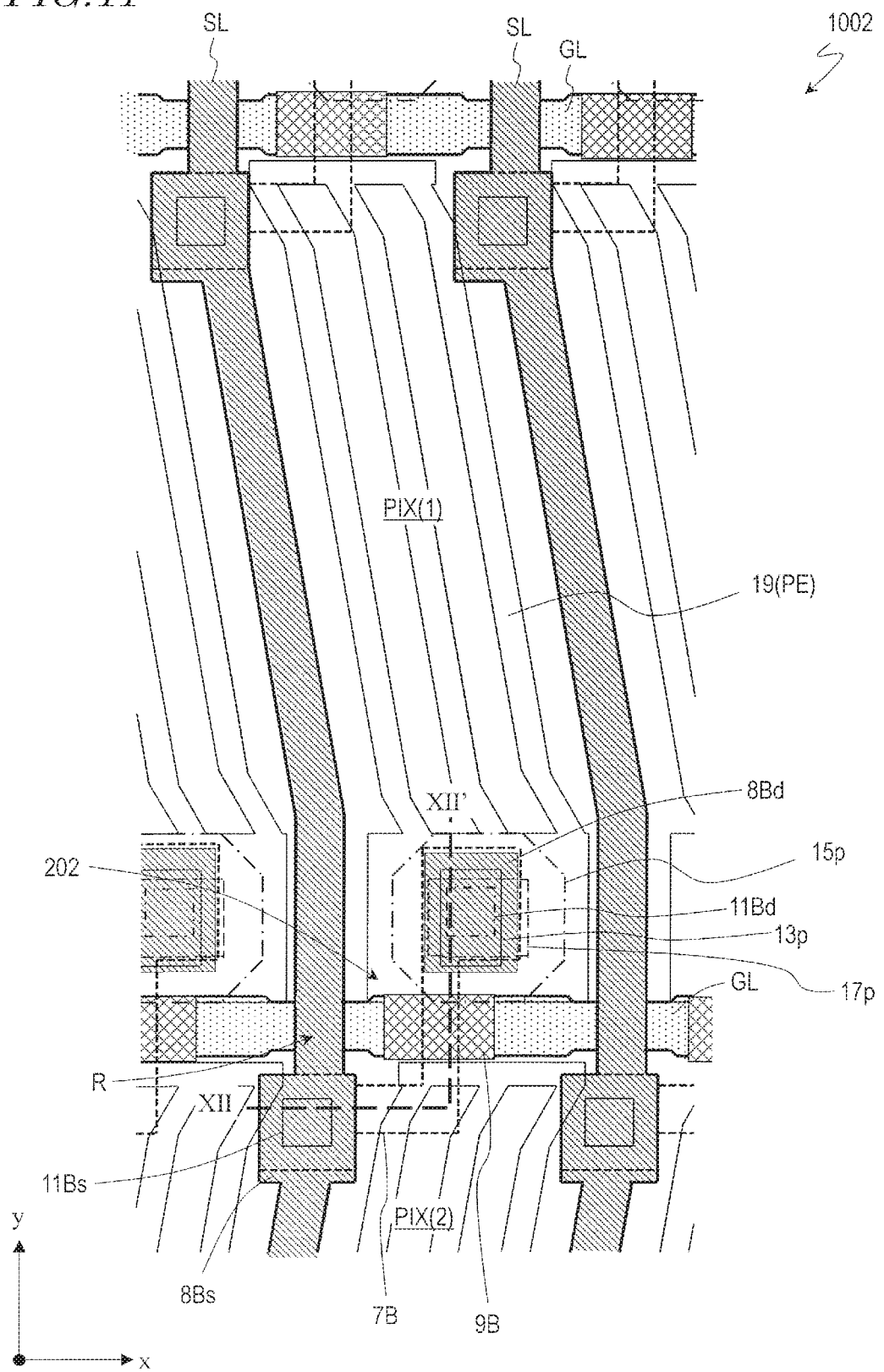
FIG. 11 is a plan view illustrating a pixel region PIX of the active matrix substrate 1002 of the second embodiment.
Figure 12:
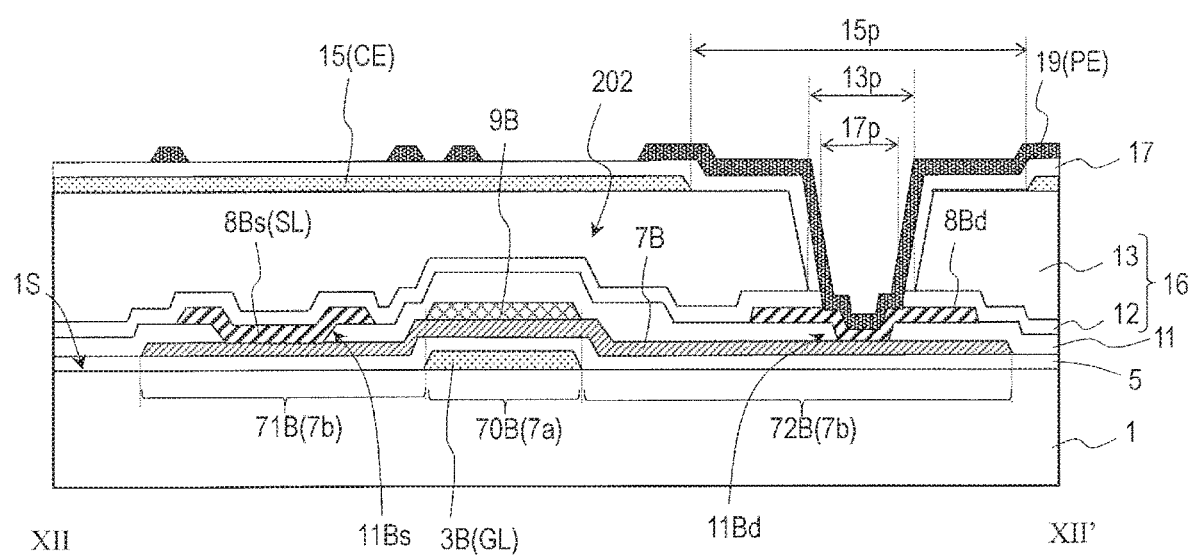
FIG. 12 is a schematic cross-sectional view showing a second TFT 202 taken along line XII-XII' of FIG. 11.

FIG. 10 is a schematic cross-sectional view showing a first TFT 102, which is a circuit TFT. FIG. 11 is a plan view illustrating a pixel region PIX of an active matrix substrate 1002 of the present embodiment. FIG. 12 is a schematic cross-sectional view of a second TFT 202, which is a pixel TFT, showing a cross-sectional structure taken along line XII-XII' of FIG. 11. Like elements to those of FIGS. 2 to 4B are denoted by like reference numerals. Like elements to those of the embodiment described above may not be further described below.

The first TFT 102 is a top gate structure or double gate structure TFT having a similar configuration to that of the first TFT 101 shown in FIG. 2. Note however that with the first TFT 102, the upper gate electrode 10A and the gate insulating layer 9A are patterned by using separate masks, and their side surfaces are not aligned with each other. On the cross section along the channel length direction of the first TFT 102, the width of the upper gate electrode 10A may be smaller than the width of the gate insulating layer 9A. In this case, the low resistance region 7b of the first oxide semiconductor layer 7A is defined by the width of the gate insulating layer 9A. That is, as seen from the normal direction to the primary surface 1S of the substrate 1, the portion 7a of the first oxide semiconductor layer 7A that overlaps with the gate insulating layer 9A is to be the first semiconductor region, and the portion that does not overlap with the gate insulating layer 9A is to be the low resistance region 7b that has a lower specific resistance than the first semiconductor region 7a.

Each pixel region PIX of the active matrix substrate 1002 includes the second TFT 202 as a pixel TFT.

The second TFT 202 has a similar structure to that of the second TFT 201 shown in FIG. 4A and FIG. 4B. Note however that it does not include, on the island-shaped insulator layer 9B, a conductive layer (the island-shaped conductor layer 10B shown in FIG. 4A and FIG. 4B) that is formed from the same conductive film as the upper gate electrode of the first TFT (i.e., formed in the upper metal layer). In this example, the upper insulating layer 11 is formed on the island-shaped insulator layer 9B so as to be in contact with the upper surface and the side surface of the island-shaped insulator layer 9B.

While the second TFT 202 is arranged so that the channel length direction of the channel region is the y direction (vertical TFT arrangement) in FIG. 10, it may be arranged so that the channel length direction is the x direction (horizontal TFT arrangement). For example, the second TFT 202 may have the same structure as the TFT 201a shown in FIG. 8 and FIG. 9 except that it does not include the island-shaped conductor layer 10B.

Also in the present embodiment, since the lower insulating layer 5 and the upper insulating layer 11 are located between the source bus line SL and the gate bus line GL in the intersection R, it is possible to reduce the capacitance Cgs.

In the present embodiment, a conductive layer formed in the upper metal layer is not arranged over the channel region 70B. Therefore, backlight light is not reflected/scattered by the upper metal layer (e.g., the island-shaped conductor layer 10B of the embodiment described above), and it is therefore possible to further prevent the transmitted light from being disturbed. Therefore, by using the active matrix substrate 1002 in a display device, it is possible to improve the display quality. Since there is no need to increase the width of the lower gate electrode 3B and the gate bus line GL while taking into consideration multiple reflections/scattering of light due to the lower gate electrode 3B in the gate metal layer, the gate bus line GL and the upper metal layer, it is possible to reduce the width of the lower gate electrode 3B and the gate bus line GL. As a result, the degree of freedom in pixel layout increases, and it is possible to improve the pixel aperture ratio. Moreover, since an indirect capacitance with the upper metal layer as a middle electrode does not occur, it is possible to more effectively reduce the bus line capacity and the pixel parasitic capacitance.

<Method for Manufacturing Active Matrix Substrate 1002>

Figure 13:
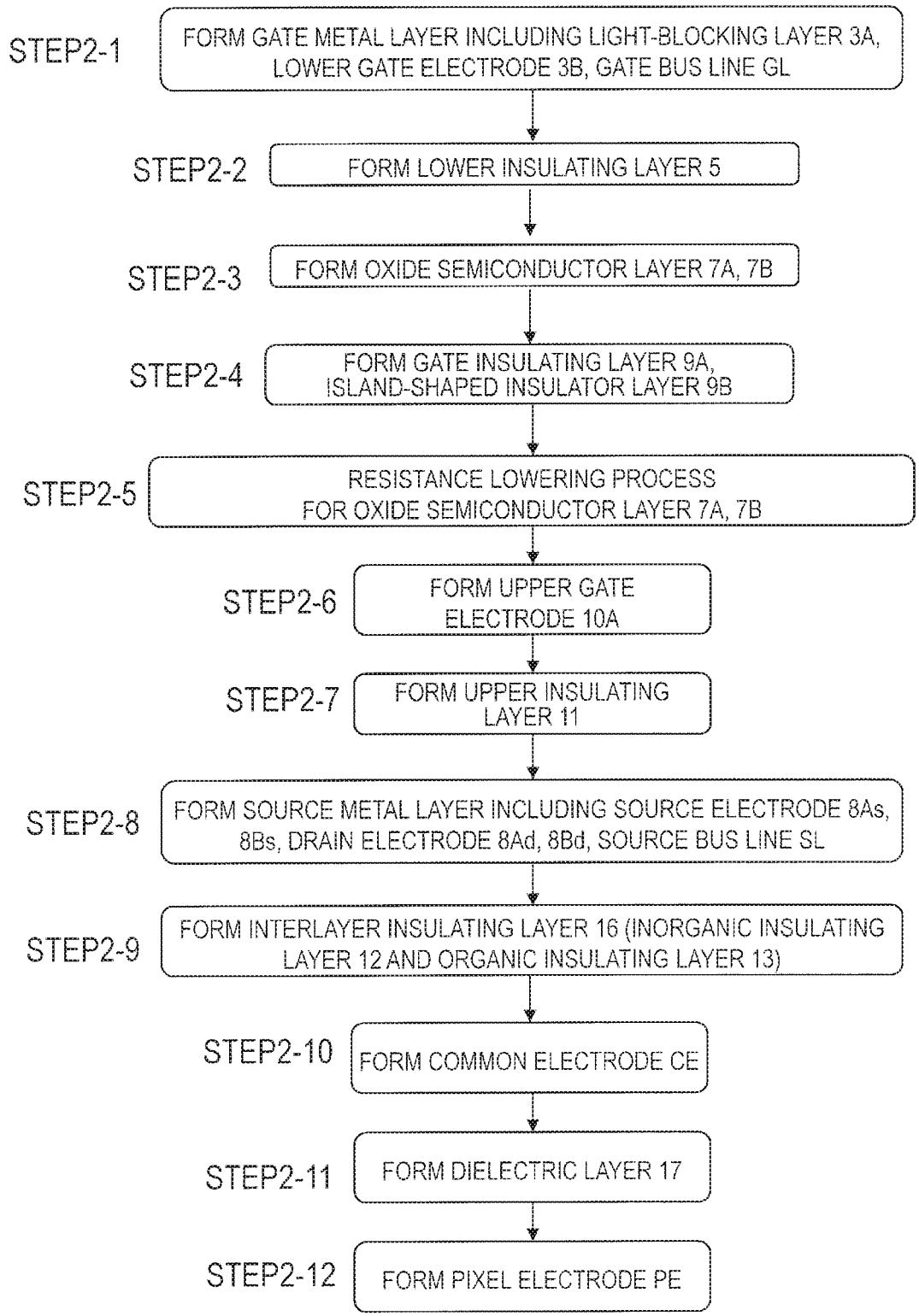
FIG. 13 is a flow chart showing an example of a method for manufacturing the active matrix substrate 1002.

Referring to FIGS. 10 to 13, an example of a method for manufacturing the active matrix substrate 1002 will now be described. FIG. 13 is a flow chart showing an example of a method for manufacturing the active matrix substrate 1001.

The manufacturing method of the present embodiment is different from the embodiment (FIG. 7) described above in that the upper gate electrode 10A is formed after a resistance lowering process for the first oxide semiconductor layer 7A and the second oxide semiconductor layer 7B is performed by using the gate insulating layer 9A and the island-shaped insulator layer 9B (or a resist layer used for patterning the gate insulating layer 9A and the island-shaped insulator layer 9B) as a mask.

In the following description, the method of formation, the material, the thickness, etc., of each layer may not be further described below if they are similar to those of the embodiment described above (FIG. 7).

STEPS 2-1 to 2-3

A gate metal layer including the gate bus line GL, the lower conductive layer 3A of the first TFT 101 and the lower gate electrode 3B of the second TFT 201 is formed on the substrate 1 (STEP 2-1). Next, the lower insulating layer 5 that covers the gate metal layer is formed (STEP 2-2), and the first oxide semiconductor layer 7A and the second oxide semiconductor layer 7B are formed on the lower insulating layer 5 (STEP 2-3). These steps are similar to STEPS 1-1 to 1-3 of FIG. 7.

Step 2-4

Then, an insulating film is formed so as to cover the first oxide semiconductor layer 7A and the second oxide semiconductor layer 7B. Then, a second resist mask is formed on the insulating film, and the insulating film is patterned by using the second resist mask. Thus, the gate insulating layer 9A and the island-shaped insulator layer 9B are obtained.

Step 2-5

Then, a resistance lowering process for the first oxide semiconductor layer 7A and the second oxide semiconductor layer 7B is performed by using the second resist mask or by using the gate insulating layer 9A and the island-shaped insulator layer 9B as a mask. Thus, portions of the first oxide semiconductor layer 7A and the second oxide semiconductor layer 7B that are exposed from the gate insulating layer 9A and the island-shaped insulator layer 9B are to be the low resistance region 7b that has a lower specific resistance than the other portions that are covered by these layers. The method for the resistance lowering process may be similar to that of the embodiment described above.

Step 2-6

After removing the second resist mask, an upper gate conductive film is formed so as to cover the gate insulating layer 9A and the island-shaped insulator layer 9B. Next, a third resist mask is formed on the upper gate conductive film, and the upper gate conductive film is patterned by using the third resist mask, thereby forming the upper gate electrode 10A on the gate insulating layer 9A. A portion of the upper gate conductive film that is located on the island-shaped insulator layer 9B is removed. Thus, in the present embodiment, the gate insulating layer 9A and the island-shaped insulator layer 9B of the first and second TFTs and the upper gate electrode 10A of the first TFT are patterned by using separate resist masks.

STEPS 2-7 to 2-12

Thereafter, the upper insulating layer 11, the source metal layer, the lower transparent electrode 15, the dielectric layer 17 and the upper transparent electrode 19 are formed by a method similar to the embodiment described above (STEPS 1-6 to 1-12). Thus, the active matrix substrate 1002 is manufactured.

Note that the method for manufacturing the active matrix substrate 1002 is not limited to the method described above. For example, without performing a resistance lowering process such as a plasma treatment, an insulating film that reduces an oxide semiconductor such as a nitride film may be used to lower the resistance of only a portion of the oxide semiconductor layers 7A and 7B. Specifically, by using an insulating film that reduces an oxide semiconductor such as an oxide film (e.g., a silicon oxide film) as the gate insulating layer 9A and the island-shaped insulator layer 9B and a nitride film (e.g., a silicon nitride film) as the upper insulating layer 11, the resistance of the regions of the oxide semiconductor layers 7A and 7B that are in contact with the nitride film can be made lower than that of the regions that are in contact with the oxide film.

<Variation>

Figure 14:
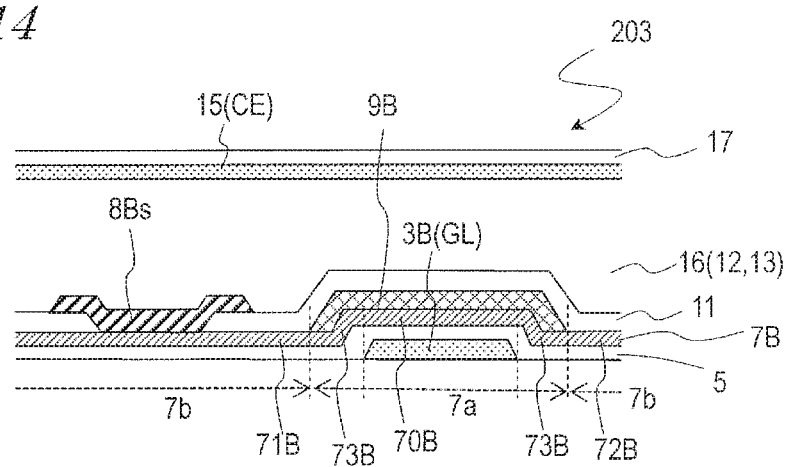
FIG. 14 is a schematic cross-sectional view showing another second TFT 203 of the second embodiment.

FIG. 14 is a schematic cross-sectional view showing a second TFT 203 of a variation of the present embodiment.

With the second TFT 203 of the variation, the width of the island-shaped insulator layer 9B in the channel length direction is larger than the width of the lower gate electrode 3B in the channel length direction. Since the island-shaped insulator layer 9B is light transmissive, problems such as a decrease in the pixel aperture ratio and multiple reflections do not occur even if the size of the island-shaped insulator layer 9B is increased.

The second oxide semiconductor layer 7B of the second TFT 203 includes the first semiconductor region 7a that overlaps with the island-shaped insulator layer 9B and the low resistance region 7b that does not overlap with the island-shaped insulator layer 9B, as seen from the normal direction to the primary surface 1S of the substrate 1. The first semiconductor region 7a includes the channel region 70B that overlaps with the lower gate electrode 3B and a third region 73B that does not overlap with the lower gate electrode 3B, as seen from the normal direction to the primary surface 1S of the substrate 1. The third region 73B is located between the channel region 70B and the low resistance region 7b (the first region 71B or the second region 72B). Such a configuration can easily be obtained by performing a resistance lowering process for the second oxide semiconductor layer 7B using the island-shaped insulator layer 9B as a mask.

In this variation, by controlling the size of the island-shaped insulator layer 9B, it is possible to arrange, over a predetermined width, the third region (referred to also as the high resistance region or the offset region) 73B that has a higher specific resistance than the first region 71B and the second region 72B, between the channel region 70B of the second oxide semiconductor layer 7B and the first region 71B or the second region 72B. By providing the third region 73B, it is possible to reduce the OFF leak current and realize intended OFF characteristics.

Third Embodiment

The active matrix substrate of the present embodiment is different from the embodiment described above in that a further insulating layer is arranged in the intersection between the source bus line SL and the gate bus line GL.

Figure 15A:
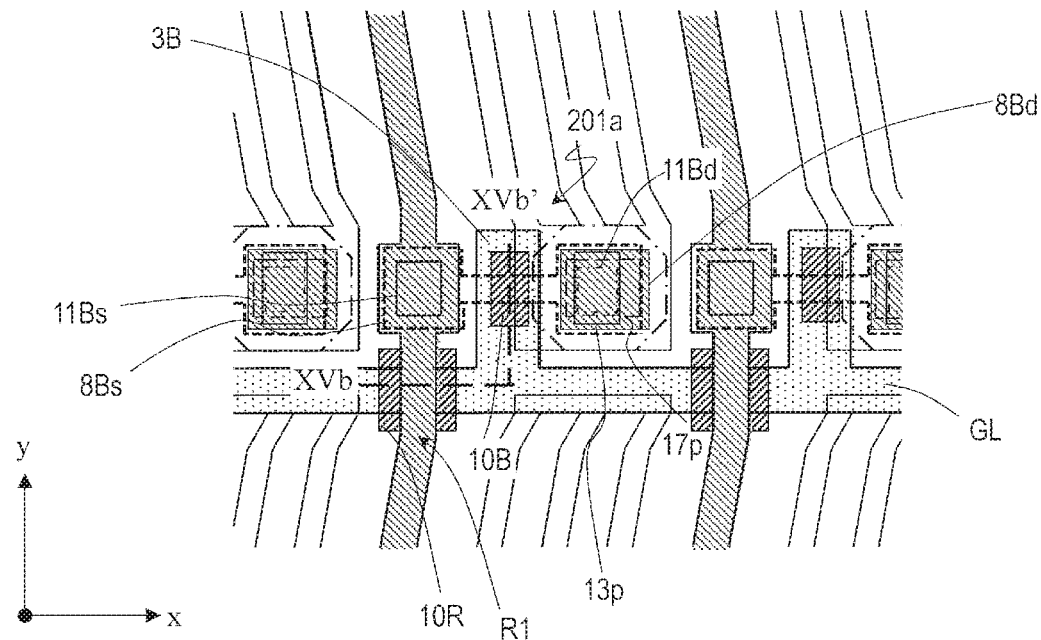
FIG. 15A is a schematic plan view showing a portion of a pixel region PIX of the third embodiment.
Figure 15B:
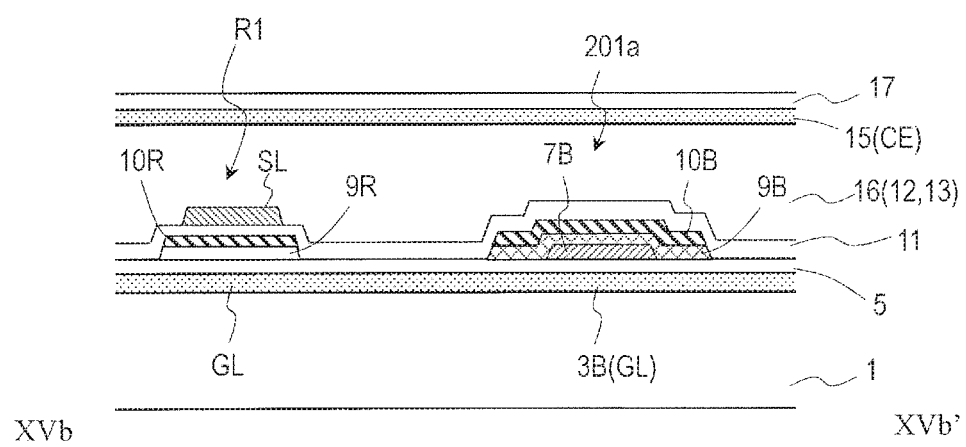
FIG. 15B is a schematic cross-sectional view showing the second TFT and an intersection R1 taken along line XVb-XVb' of FIG. 15A.

FIG. 15A and FIG. 15B are a plan view and a cross-sectional view taken along line XVb-XVb', respectively, showing a portion of a pixel region PIX of the present embodiment.

In the intersection R1 between the source bus line SL and the gate bus line GL, another island-shaped insulator layer (referred to also as the second island-shaped insulator layer) 9R and another island-shaped conductor layer (referred to also as the second island-shaped conductor layer) 10R are arranged between the lower insulating layer 5 and the upper insulating layer 11. The second island-shaped insulator layer 9R is formed by using the same insulating film as the gate insulating layer 9A and the island-shaped insulator layer 9B. The second island-shaped conductor layer 10R is formed from the same conductive film (i.e., in the upper metal layer) as the upper gate electrode 10A and the island-shaped conductor layer 10B. Otherwise, the structure is similar to that of FIG. 8.

Figure 16:
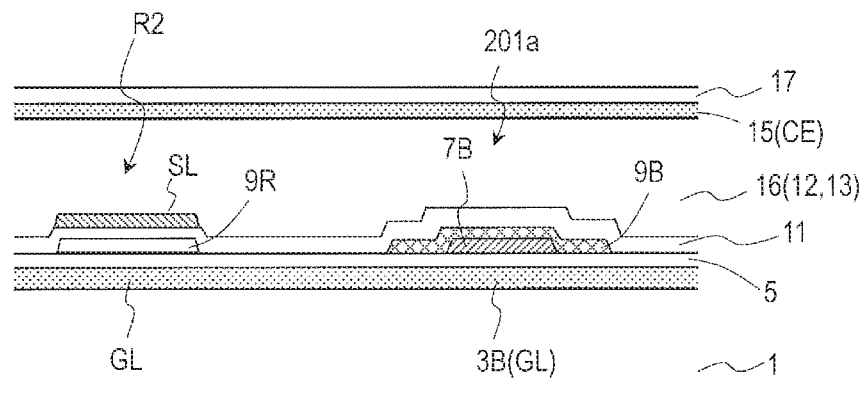
FIG. 16 is a schematic cross-sectional view showing a portion of another pixel region PIX of the third embodiment.

FIG. 16 is a cross-sectional view illustrating another intersection R2 of the present embodiment. In the intersection R2 between the source bus line SL and the gate bus line GL, the second island-shaped insulator layer 9R is arranged and the second island-shaped conductor layer 10R is not arranged between the lower insulating layer 5 and the upper insulating layer 11. Otherwise, the structure is similar to that of FIG. 15A and FIG. 15B.

According to the present embodiment, it is possible to further reduce the capacitance in the intersections R1 and R2 by further providing, in the intersections R1 and R2 between the source bus line SL and the gate bus line GL, the second island-shaped insulator layer 9R or the second island-shaped insulator layer 9R and the second island-shaped conductor layer 10R between the lower insulating layer 5 and the upper insulating layer 11. As a result, the capacitance of the source bus line SL and the gate bus line GL is reduced, and it is therefore possible to realize a further reduction in the size of the peripheral circuit.

The intersections R1 and R2 of the present embodiment is applicable to various active matrix substrates of the horizontal TFT arrangement or the horizontal TFT arrangement described above. The intersections R1 and R2 may be applied to the active matrix substrate of the first embodiment (FIG. 3, FIG. 8, etc.) where the pixel TFT includes the island-shaped insulator layer 9B and the island-shaped conductor layer 10B, or may be applied to the active matrix substrate of the second embodiment (FIG. 11, etc.) where the pixel TFT includes the island-shaped insulator layer 9B and the island-shaped conductor layer 10B.

The second island-shaped insulator layer 9R can be formed simultaneously with the gate insulating layer 9A and the island-shaped insulator layer 9B, and the second island-shaped conductor layer 10R can be formed simultaneously with the upper gate electrode 10A and the island-shaped conductor layer 10B (the upper gate electrode 10A when the island-shaped conductor layer 10B is not formed). Therefore, the active matrix substrate of the present embodiment can be manufactured by using a process similar to the first embodiment or the second embodiment without increasing the number of photomasks. For example, the intersection R2 shown in FIG. 16 is preferably applied to the active matrix substrate of the second embodiment. Thus, it is possible to form the intersection R2 having a small capacitance without increasing the manufacturing process.

(Regarding Oxide Semiconductor)

The oxide semiconductor included in the first and second oxide semiconductor layers 7A and 7B may be an amorphous oxide semiconductor or may be a crystalline oxide semiconductor having a crystalline portion. Examples of the crystalline oxide semiconductor include a polycrystalline oxide semiconductor, a microcrystalline oxide semiconductor, and a crystalline oxide semiconductor whose c-axis is oriented generally perpendicular to the layer surface.

The oxide semiconductor layers 7A and 7B may have a layered structure of two layers or more. When the oxide semiconductor layers 7A and 7B have a layered structure, the oxide semiconductor layers 7A and 7B may include an amorphous oxide semiconductor layer and a crystalline oxide semiconductor layer. Alternatively, it may include a plurality of crystalline oxide semiconductor layers of different crystalline structures. It may include a plurality of amorphous oxide semiconductor layers. When the oxide semiconductor layers 7A and 7B have a two-layer structure including an upper layer and a lower layer, the energy gap of the oxide semiconductor included in the upper layer preferably has a greater energy gap than that of the oxide semiconductor included in the lower layer. Note however that when the difference in energy gap between these layers is relatively small, the energy gap of the oxide semiconductor of the lower layer may be greater than the energy gap of the oxide semiconductor of the upper layer.

The material, the structure, the film formation method of the amorphous oxide semiconductor and each of the crystalline oxide semiconductors, and the configuration of an oxide semiconductor layer having a layered structure, etc., are described in Japanese Laid-Open Patent Publication No. 2014-007399, for example. The disclosure of Japanese Laid-Open Patent Publication No. 2014-007399 is herein incorporated by reference in its entirety.

The oxide semiconductor layers 7A and 7B may include at least one metal element from among In, Ga and Zn, for example. In the present embodiment, the oxide semiconductor layers 7A and 7B include an In—Ga—Zn—O-based semiconductor (e.g., indium gallium zinc oxide), for example. Herein, an In—Ga—Zn—O-based semiconductor is a ternary oxide of In (indium), Ga (gallium) and Zn (zinc), and there is no particular limitation on the ratio (composition ratio) between In, Ga and Zn, examples of which include In:Ga:Zn=2:2:1, In:Ga:Zn=1:1:1 and In:Ga:Zn=1:1:2, for example. Such oxide semiconductor layers 7A and 7B can be formed from an oxide semiconductor film including an In—Ga—Zn—O-based semiconductor.

An In—Ga—Zn—O-based semiconductor may be amorphous or crystalline. A crystalline In—Ga—Zn—O-based semiconductor is preferably a crystalline In—Ga—Zn—O-based semiconductor whose c-axis is oriented generally perpendicular to the layer surface.

Note that crystalline structures of crystalline In—Ga—Zn—O-based semiconductors are disclosed in, for example, Japanese Laid-Open Patent Publication No. 2014-007399, supra, Japanese Laid-Open Patent Publication No. 2012-134475, Japanese Laid-Open Patent Publication No. 2014-209727, etc. The disclosures of Japanese Laid-Open Patent Publication No. 2012-134475 and Japanese Laid-Open Patent Publication No. 2014-209727 are herein incorporated by reference in their entirety. Since TFTs including an In—Ga—Zn—O-based semiconductor layer have a high mobility (more than 20 times that of an a-SiTFT) and a low leak current (less than 1/100 that of an a-SiTFT), they can desirably be used as driver TFTs (e.g., TFTs included in driver circuits provided around the display region including a plurality of pixels and on the same substrate as the display region) and pixel TFTs (TFTs provided in pixels).

The oxide semiconductor layers 7A and 7B may include another oxide semiconductor, instead of an In—Ga—Zn—O-based semiconductor. For example, it may include an In—Sn—Zn—O-based semiconductor (e.g., $In_2O_3$—$SnO_2$—ZnO; InSnZnO). An In—Sn—Zn—O-based semiconductor is a ternary oxide of In (indium), Sn (tin) and Zn (zinc). Alternatively, the oxide semiconductor layers 7A and 7B may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, an In—Ga—Zn—Sn—O-based semiconductor, etc.

The embodiments of the present invention are widely applicable to various semiconductor devices including oxide semiconductor TFTs. For example, they are applicable to circuit boards such as active matrix substrates, display devices such as liquid crystal display devices, organic electroluminescence (EL) display devices, inorganic electroluminescent display devices and MEMS display devices, image pickup devices such as image sensor devices, and various electronic devices such as image input devices, fingerprint reader devices and semiconductor memory devices. Particularly, they are suitably applicable to high-definition liquid crystal display devices.

What is claimed is:

1. An active matrix substrate having a display region including a plurality of pixel regions and a non-display region provided around the display region, the active matrix substrate comprising:
a substrate having a primary surface; a peripheral circuit provided in the non-display region that is supported on the primary surface side of the substrate and includes at least one first TFT; a second TFT that is arranged for each of the plurality of pixel regions in the display region; a source metal layer that includes a plurality of source bus lines extending in a first direction; and a gate metal layer that includes a plurality of gate bus lines extending in a second direction that crosses the first direction, wherein:
the at least one first TFT is a top gate structure TFT that includes a first oxide semiconductor layer and an upper gate electrode arranged on a portion of the first oxide semiconductor layer with a gate insulating layer interposed therebetween or a double gate structure TFT that additionally includes, as compared with the top gate structure TFT, a first lower gate electrode arranged on the substrate side of the first oxide semiconductor layer;
each second TFT is a bottom gate structure TFT that includes a second oxide semiconductor layer and a second lower gate electrode arranged on the substrate side of the second oxide semiconductor layer with a lower insulating layer interposed therebetween, wherein a gate electrode is absent above the second oxide semiconductor layer;
the each second TFT includes:
an island-shaped insulator layer that is arranged on a portion of the second oxide semiconductor layer so as to overlap with at least a portion of the second lower gate electrode, as seen from a normal direction to the primary surface of the substrate;
an upper insulating layer that is arranged on the second oxide semiconductor layer and the island-shaped insulator layer;
a source electrode that is arranged on the upper insulating layer and is in contact with another portion of the second oxide semiconductor layer in a source-side opening formed in the upper insulating layer;
the second oxide semiconductor layer is formed from a same semiconductor film as the first oxide semiconductor layer of the at least one first TFT, the island-shaped insulator layer is formed from a same insulating film as the gate insulating layer of the at least one first TFT, the second lower gate electrode is formed in the gate metal layer, and the source electrode is formed in the source metal layer;
a portion of the second oxide semiconductor layer that does not overlap with the island-shaped insulator layer is a low resistance region that has a lower specific resistance than a portion thereof that overlaps with the island-shaped insulator layer, as seen from the normal direction to the primary surface of the substrate; and
in an intersection where one of the plurality of source bus lines and one of the plurality of gate bus lines cross each other, the lower insulating layer and the upper insulating layer are located between the one source bus line and the one gate bus line.

2. The active matrix substrate according to claim 1, further comprising an island-shaped conductor layer that is arranged between the island-shaped insulator layer and the upper insulating layer,
wherein the island-shaped conductor layer is formed from a same conductive film as the upper gate electrode of the at least one first TFT.

3. The active matrix substrate according to claim 2, wherein the island-shaped conductor layer is electrically separated from other interconnects.

4. The active matrix substrate according to claim 2, wherein the island-shaped conductor layer is electrically floating.

5. The active matrix substrate according to claim 2, wherein the island-shaped conductor layer is located inside the second lower gate electrode in a channel length direction of the each second TFT, as seen from the normal direction to the primary surface of the substrate.

6. The active matrix substrate according to claim 2, wherein the island-shaped conductor layer is located inside the second lower gate electrode, as seen from the normal direction to the primary surface of the substrate.

7. The active matrix substrate according to claim 2, wherein a side surface of the island-shaped conductor layer and a side surface of the island-shaped insulator layer are aligned with each other, and a side surface of the upper gate electrode and a side surface of the gate insulating layer are aligned with each other.

8. The active matrix substrate according to claim 1, wherein an entire upper surface of the island-shaped insulator layer is in direct contact with the upper insulating layer.

9. The active matrix substrate according to claim 8, wherein as seen from the normal direction to the primary surface of the substrate, a portion of the second oxide semiconductor layer that overlaps with the island-shaped insulator layer includes a channel region that overlaps with the second lower gate electrode and a high resistance region that does not overlap with the second lower gate electrode, wherein the high resistance region is located between the channel region and the low resistance region.

10. The active matrix substrate according to claim 1, wherein:
the low resistance region of the second oxide semiconductor layer includes a first region and a second region that are located on opposite sides of the island-shaped insulator layer, as seen from the normal direction to the primary surface of the substrate;
the first region is electrically connected to the source electrode; and
the second region is electrically connected to a pixel electrode that is provided for each of the plurality of pixel regions.

11. The active matrix substrate according to claim 10, wherein the each second TFT further includes a drain electrode that is arranged on the upper insulating layer and is in contact with the second region in a drain-side opening formed in the upper insulating layer, and the second region is electrically connected to the pixel electrode with the drain electrode interposed therebetween.

12. The active matrix substrate according to claim 1, wherein:
- the low resistance region of the second oxide semiconductor layer includes a first region and a second region that are located on opposite sides of the island-shaped insulator layer, as seen from the normal direction to the primary surface of the substrate;
- the first region is electrically connected to the source electrode; and
- the second region includes a portion that functions as a pixel electrode for each of the plurality of pixel regions.

13. The active matrix substrate according to claim 1, wherein:
- the source electrode is electrically connected to one of the plurality of source bus lines; and
- the second lower gate electrode is electrically connected to one of the plurality of gate bus lines.

14. The active matrix substrate according to claim 1, further comprising another island-shaped insulator layer that is arranged between the lower insulating layer and the upper insulating layer in the intersection.

15. The active matrix substrate according to claim 14, further comprising another island-shaped conductor layer that is arranged between the another island-shaped insulator layer and the upper insulating layer in the intersection,
- wherein the another island-shaped conductor layer is formed from a same conductive film as the upper gate electrode of the at least one first TFT.

16. The active matrix substrate according to claim 1, wherein the first oxide semiconductor layer and the second oxide semiconductor layer include an In—Ga—Zn—O-based semiconductor.

17. A display device comprising the active matrix substrate according to claim 1.

* * * * *